(12) United States Patent
Poothokaran et al.

(10) Patent No.: US 10,874,039 B2
(45) Date of Patent: Dec. 22, 2020

(54) COMPONENT MOUNTING SYSTEM, COMPONENT MOUNTING DEVICE, AND BOARD TRANSPORT METHOD

(71) Applicant: Panasonic Intellectual Property Management Co., Ltd., Osaka (JP)

(72) Inventors: Joy Poothokaran, Fukuoka (JP); Kazuyuki Nagase, Yamanashi (JP); Michiaki Mawatari, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 112 days.

(21) Appl. No.: 16/200,704

(22) Filed: Nov. 27, 2018

(65) Prior Publication Data
US 2019/0174660 A1 Jun. 6, 2019

(30) Foreign Application Priority Data
Dec. 6, 2017 (JP) ................. 2017-233996

(51) Int. Cl.
H05K 13/00 (2006.01)
H05K 3/36 (2006.01)
H05K 3/00 (2006.01)
H05K 13/08 (2006.01)
H05K 13/04 (2006.01)

(52) U.S. Cl.
CPC ..... *H05K 13/0061* (2013.01); *H05K 13/0882* (2018.08); *H05K 13/0465* (2013.01)

(58) Field of Classification Search
None
See application file for complete search history.

(56) References Cited

U.S. PATENT DOCUMENTS

| 5,262,954 | A | * | 11/1993 | Fujino | ................ | H05K 13/0882 700/112 |
| 5,564,183 | A | * | 10/1996 | Satou | ..................... | B23K 31/12 29/840 |
| 5,659,947 | A | * | 8/1997 | Eilers | ................... | H05K 13/085 29/740 |
| 5,692,292 | A | * | 12/1997 | Asai | ................... | H05K 13/0061 198/341.04 |
| 6,788,989 | B2 | * | 9/2004 | Kodama | ............ | H05K 13/0882 700/117 |

FOREIGN PATENT DOCUMENTS

JP  2013-214588  10/2013

* cited by examiner

*Primary Examiner* — Kavel Singh
(74) *Attorney, Agent, or Firm* — Pearne & Gordon LLP

(57) ABSTRACT

A component mounting system includes a board transport line for transporting a board from an upstream to a downstream and a work station disposed in the board transport line and performing component mounting work. The board transport line transports a board introduced in the downstream of the work station to the work station, and transports the board from the work station to the downstream when mounting of a component on the board is completed in the work station.

10 Claims, 17 Drawing Sheets

COMPONENT MOUNTING SYSTEM, COMPONENT MOUNTING DEVICE, AND BOARD TRANSPORT METHOD

BACKGROUND

1. Technical Field

The present disclosure relates to a component mounting system that manufactures a mounting board in which a component is mounted on a board, a component mounting device used in the component mounting system, and a board transport method in the component mounting system.

2. Description of the Related Art

In a component mounting system that manufactures a mounting board in which a component is mounted on a board, board transport conveyors such as a screen printing device, a component mounting device, and a reflow device are connected to form a board transport line (for example, Japanese Patent Unexamined Publication No. 2013-214588). In recent years, a configuration has been used in which an inspection device is disposed between the component mounting device and the reflow device, a component placing state on a board before reflow is inspected to perform feedback to the component mounting device.

In the component mounting system, it is necessary to perform data adjustment of each device prior to a start of production. In a case where the inspection device is disposed with the above-described device configuration, it takes time to adjust the inspection device to appropriately inspect a placed state. Among components, in a case where adjustment of a component having a special shape with less past record of use is performed, it takes a lot of time and labor, in particular. Therefore, in the data adjustment of the inspection device, it is necessary to prepare an adjustment board used for adjustment of the inspection device with the component mounting device prior to the adjustment of other devices. The adjustment of the inspection device in parallel with the adjustment of other devices is performed, so that an adjustment time of the entire component mounting system is shortened.

SUMMARY

According to the disclosure, there is provided a component mounting system including: a board transport line for transporting a board from an upstream to a downstream; and a work station disposed in the board transport line and performing component mounting work. The board transport line transports a board introduced in the downstream of the work station to the work station, and transports the board from the work station to the downstream when mounting of a component on the board is completed in the work station.

According to the disclosure, there is provided a component mounting device including: a board transporter constituting a part of a board transport line for transporting a board from an upstream to a downstream; and a component mounting head mounting a component on the board in a work station in the middle of the board transporter. The board transporter has a first operation mode in which a board received from an upstream device is transported to the work station and the board is delivered from the work station to a downstream device when mounting of the component on the board is completed in the work station, and a second operation mode in which a board introduced in the downstream of the work station is transported to the work station.

According to the disclosure, there is provided a board transport method in a component mounting device including a board transporter constituting a part of a board transport line for transporting a board from an upstream to a downstream, and a component mounting head mounting a component on the board in a work station in the middle of the board transporter, the method including: transporting a board introduced in the downstream of the work station to the work station by the board transporter; transporting the board to the upstream of a stop position which is set in the work station by the board transporter; and transporting the board to the downstream and stopping the board at the stop position by the board transporter.

According to the disclosure, it is possible to quickly supply the board to a component mounting device of a target.

DETAILED DESCRIPTION

When a board for adjustment is created, in the related art, a board on which a component is mounted is introduced from an upstream device of a component mounting device to a board transport line, the board is transported to a component mounting device of a target, and a component necessary for adjustment of an inspection device is mounted by a component mounting device. However, in such a method of the related art, in a case where there is a distance from a position at which the board is introduced in the component mounting device of a target, there is a problem that it takes time to transport the board.

In order to avoid such a problem, it is conceivable to directly place the board on a board transport conveyor of the component mounting device of a target. However, in a state where a component supply device such as a tape feeder is set, it is not easy to access the board transport conveyor disposed inside the device from an outside of the device, and in the related art, it takes labor and time to supply the board when the board for adjustment is created. The problem is not limited to creation of the board for adjustment of the inspection device and it is common even in a case where it is necessary to supply the board to the component mounting device of a target in order to perform work other than normal production work such as trial mounting and replenishment mounting of lack component in a specific component mounting device during an operation of the component mounting line.

Therefore, an object of the disclosure is to provide a component mounting system, a component mounting device, and a board transport method in which it is possible to quickly supply the board to a component mounting device of a target.

Figure 1:
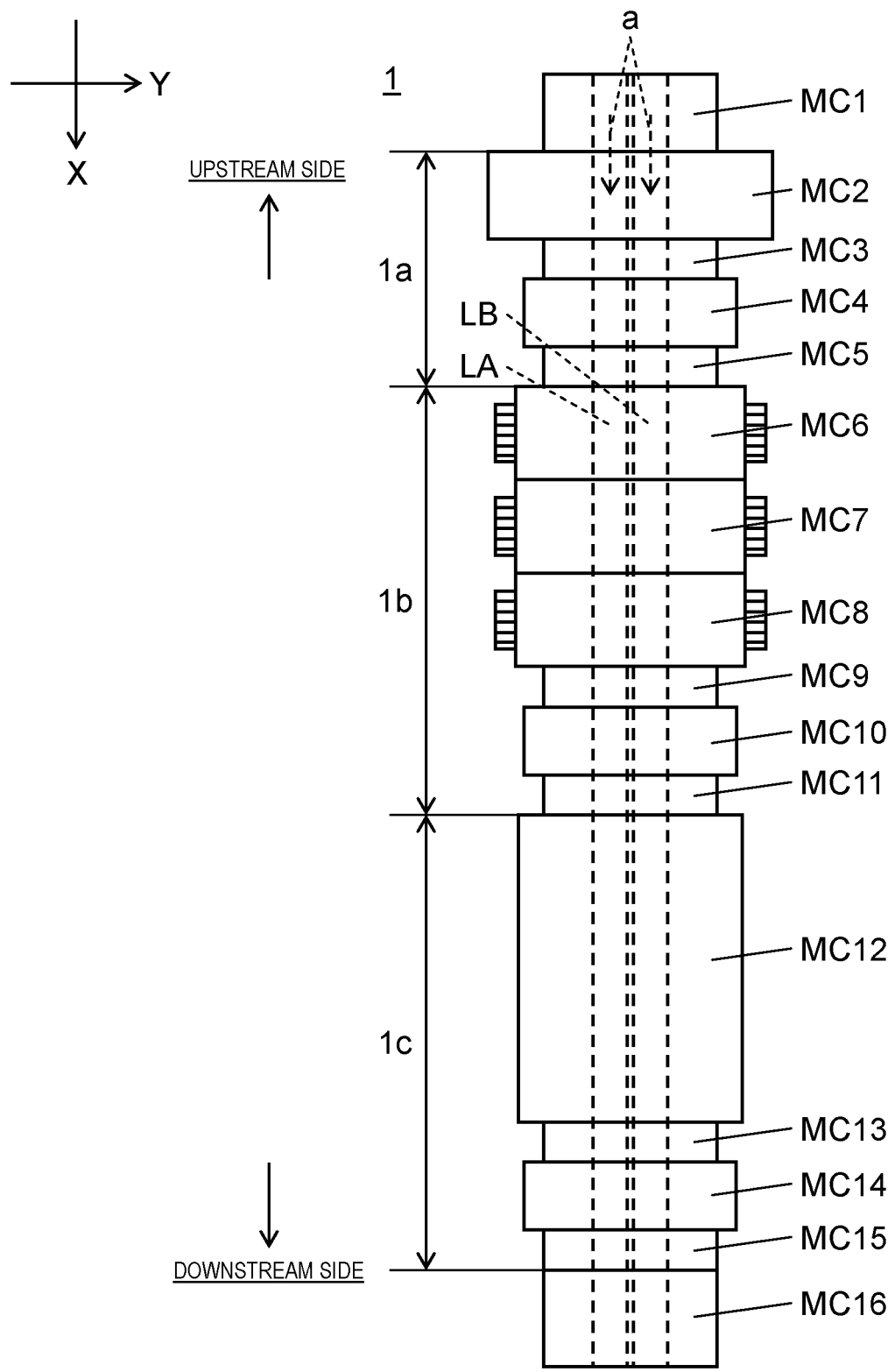
FIG. 1 is an explanatory view of a configuration of a component mounting system of an embodiment of the disclosure.

Next, embodiments of the disclosure will be described with reference to the drawings. First, an entire configuration of component mounting system 1 will be described with reference to FIG. 1. Component mounting system 1 has a function of mounting a component on a board to manufacture a mounting board. A board (see board 14 illustrated in FIGS. 4A to 8B) supplied (arrow a) from board supply device MC1 in an X direction that is a board transport direction is sequentially supplied to solder printing unit 1a for printing solder, component mounter 1b for mounting a component on board 14 printed with solder, and reflow unit 1c for solder-bonding a component by heating board 14 on which the component is mounted.

Solder printing unit 1a, component mounter 1b, and reflow unit 1c are configured of a plurality of component mounting devices. Each of the component mounting devices is a multiple-line type facility including two rows of the board transporter, and two rows of board transport lines LA and LB inserting through component mounting system 1 from an upstream to a downstream are formed by connecting the board transporters in series. In a manufacturing process of the mounting board by component mounting system 1, board 14 to be worked is transported from the upstream to the downstream by board transport lines LA and LB, and work is executed by each facility described below.

In solder printing unit 1a, solder for component bonding with respect to board 14 is supplied by screen printing device MC2 by screen printing. Board 14 after solder printing is delivered to first inspection device MC4 via connecting conveyor MC3 and inspection of a solder printing state is performed here. Board 14 after the inspection is delivered to the component mounter 1b via connecting conveyor MC5.

Component mounter 1b includes three first component mounting device MC6, second component mounting device MC7, and third component mounting device MC8 which are connected in series. Components are mounted in board 14 which is delivered from connecting conveyor MC5 in the process of sequentially moving in three first component mounting device MC6, second component mounting device MC7, and third component mounting device MC8. Board 14 after component mounting is delivered to second inspection device MC10 via connecting conveyor MC9 and inspection of a component mounting state is performed here. Board 14 after inspection is delivered to reflow unit 1c via connecting conveyor MC11.

In reflow unit 1c, board 14 is heated with a predetermined heating profile in the process of passing through reflow device MC12, and thereby the solder is melted and solidified, and a component is solder-bonded to board 14. Board 14 after reflow is delivered to third inspection device MC14 via connecting conveyor MC13 and inspection after solder-bonding is performed. Board 14 after completion of the component mounting work after inspection is collected by mounting board collecting device MC16 via connecting conveyor MC15.

Figure 2:
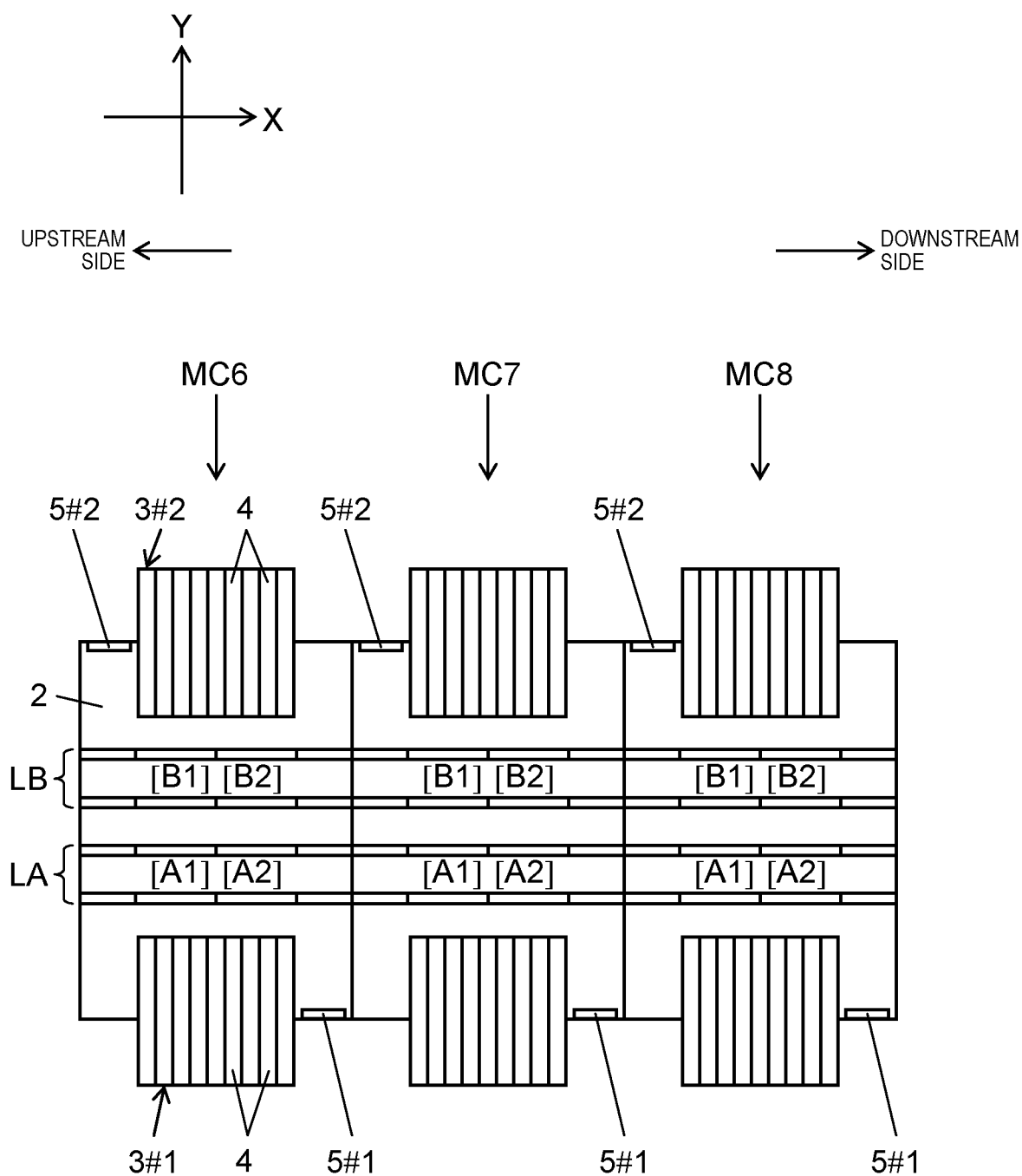
FIG. 2 is a plan view of a component mounting device in the component mounting system of an embodiment of the disclosure.

Next, configurations of three first component mounting device MC6, second component mounting device MC7, and third component mounting device MC8 disposed in component mounter 1b, and arrangement of the work stations will be described with reference to FIG. 2. These devices have the same configuration, so that only first component mounting device MC6 will be described and the description of the others will be omitted. The two rows of board transport lines LA and LB are disposed at a center of base 2 of first component mounting device MC6 in the X direction. Two work stations of work stations [A1] and [A2] from an upstream side are set in board transport line LA (lane A). Similarly, two work stations of work stations [B1] and [B2] from an upstream side are set in board transport line LB (lane B), and each of board transport lines LA and LB for transporting board 14 is configured to include a plurality of work stations in component mounter 1b.

In the embodiment, it is possible to select a transport operation mode indicating a transport form of board 14 by board transport lines LA and LB from a plurality of modes including a reverse rotation in the transport direction. That is, touch panels 5#1 and 5#2 are disposed on both side surfaces of first component mounting device MC6, and selection screens 51a, 51b, and 51c (see FIGS. 10 to 13B) are displayed on operation screens of touch panels 5#1 and 5#2. It is possible to switch the transport direction of board 14 in both forward and reverse directions in component mounter 1b by performing an operation of selecting the transport operation mode on the selection screen.

In component mounter 1b, the component mounting work targeting board 14 is performed in at least one work station of the plurality of work stations. The component suppliers 3#1 and 3#2 are disposed on outside board transport lines LA and LB in a Y direction. In the component mounting work, components picked up from component feeders 4 of component suppliers 3#1 and 3#2 are mounted on board 14 carried in one of the work stations.

As described above, in the embodiment, in the transport operation of board 14 by board transport lines LA and LB, forward and reverse switching in the transport direction can be performed, so that the component mounting work of the following working form can be executed. That is, in the transport of board 14 in the component mounting work, board transport lines LA and LB transport boards 14 introduced in the downstream of one work station for performing the component mounting work which is described above, to the work station, and a working form for transporting a board on which the component is mounted from the work station to the downstream can be executed when mounting of the component on the board is completed in the work station.

In such a working form, in order to smoothly perform a board transport operation, board transport lines LA and LB prohibit board 14 from carrying in the work station from the upstream side of the work station until introduced board 14 reaches the specific work station which is described above. When board 14 on which mounting of the component is completed is carried out from the work station, board 14 is capable of being carried in the work station from the upstream of the work station in board transport lines LA and LB.

Figure 3:
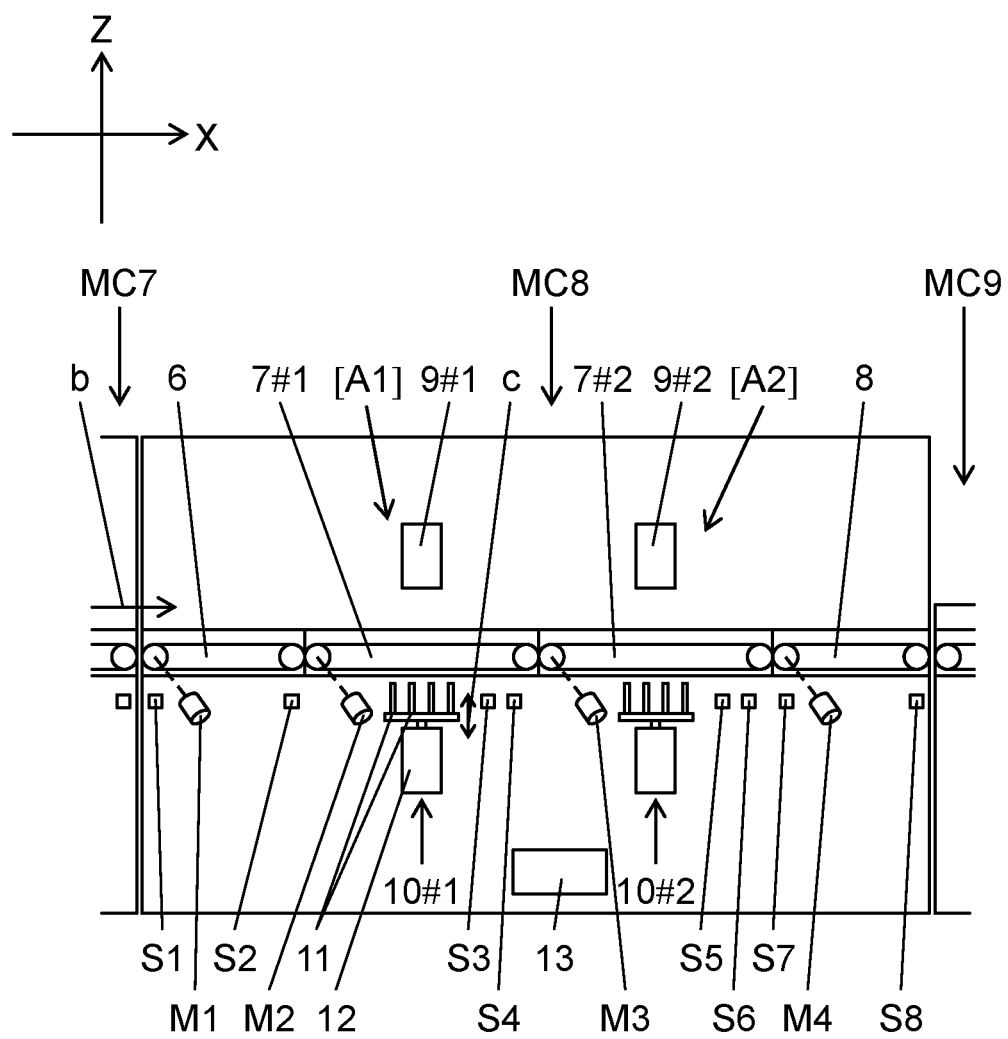
FIG. 3 is a sectional view illustrating a configuration and a function of the component mounting device in the component mounting system of an embodiment of the disclosure.

Next, configurations and functions of three first component mounting device MC6, second component mounting device MC7, and third component mounting device MC8 will be described with reference to FIG. 3. These devices have the same configuration, so that third component mounting device MC8 is illustrated as a representative example in the description. First component mounting device MC6 and second component mounting device MC7 also have the same configuration and function. Similarly, only a cross section of board transport line LA (lane A) is illustrated in board transport lines LA and LB having the same configuration, but the same applies to board transport line LB (lane B).

Third component mounting device MC8 includes a board transporter having a configuration in which a plurality of conveyor units (carry-in conveyor 6, work station conveyors 7#1 and 7#2, and carry-out conveyor 8) for transporting board 14 are disposed in series. In third component mounting device MC8, the board transporters are provided in each of board transport lines LA and LB. That is, third component mounting device MC8 includes at least one of the board transporters constituting a part of board transport lines LA and LB for transporting boards 14 from the upstream to the downstream in component mounting system 1.

The transport operations of carry-in conveyor 6, work station conveyors 7#1 and 7#2, and carry-out conveyor 8 constituting the board transporter are performed by driving conveyor driving motors M1, M2, M3, and M4, respectively. That is, board 14 (see FIGS. 4A to 4E) delivered (arrow b) from second component mounting device MC7 on the upstream side can be sequentially moved in carry-in conveyor 6, work station conveyors 7#1 and 7#2, and carry-out conveyor 8 by driving the conveyor driving motors.

Work stations [A1] and [A2] for executing the component mounting work targeting board 14 are set in work station conveyors 7#1 and 7#2 in the middle of the board transporter having such a configuration. In work stations [A1] and [A2], board lower receivers 10#1 and 10#2 are disposed below work station conveyors 7#1 and 7#2.

Each of board lower receivers 10#1 and 10#2 includes lower receiving pin 11 which is raised and lowered (arrow c) by lifting mechanism 12. In work station conveyors 7#1 and 7#2, in a state where boards 14 are carried in board lower receivers 10#1 and 10#2, boards 14 to be worked can be lower-supported by lower receiving pins 11 by driving board lower receivers 10#1 and 10#2 (see FIGS. 4A to 4E).

In each of work stations [A1] and [A2], component mounting heads 9#1 and 9#2 are disposed above work station conveyors 7#1 and 7#2. Component mounting heads 9#1 and 9#2 move between component suppliers 3#1 and 3#2 and boards 14 positioned in work stations [A1] and [A2] by a head moving mechanism (not illustrated), so that the component mounting work for mounting the components picked up from component suppliers 3#1 and 3#2 on boards 14 positioned in work stations [A1] and [A2] is executed. That is, component mounting heads 9#1 and 9#2 mount components on boards 14 in the work station in the middle of the board transporter.

In order to control the transport of board 14 by the board transporter which is described above, board detection sensors S1 and S2 are disposed in the vicinity of an upstream end and a downstream end of carry-in conveyor 6, and similarly, board detection sensors S7 and S8 are disposed in the vicinity of an upstream end and a downstream end of carry-out conveyor 8. Board detection sensors S3 and S4 are disposed in work station conveyor 7#1, and board detection sensors S5 and S6 are disposed in work station conveyor 7#2.

The purpose of detection by the board detection sensors will be described. Board detection sensor S1 detects that board 14 enters carry-in conveyor 6 from the upstream device. Board detection sensor S2 detects presence or absence of board 14 of a standby state in the delivery of board 14 from carry-in conveyor 6 to work station conveyor 7#1. Board detection sensor S3 provided in work station conveyor 7#1 is at a stop position at the time of positioning board 14 in work station [A1] and detects a tip of board 14 reached the stop position. Board detection sensor S4 is disposed in a downstream of board detection sensor S3 by a predetermined distance. It is detected whether or not board 14 is in an overrun state from the normal stop position by presence or absence of the detection of board 14 by board detection sensor S4.

Board detection sensor S5 and board detection sensor S6 provided in work station conveyor 7#2 have the same function as that of board detection sensor S3 and board detection sensor S4 in work station [A1]. Board detection sensor S7 provided in carry-out conveyor 8 detects that board 14 enters carry-out conveyor 8 from work station conveyor 7#2. Board detection sensor S8 detects that board 14 is discharged from carry-out conveyor 8.

Controller 13 is provided inside a body of third component mounting device MC8. Controller 13 controls various elements described above so that the transport and positioning of board 14 by the board transporter described above, and the component mounting operation by component mounting heads 9#1 and 9#2 are controlled. A detailed configuration and function of controller 13 will be described with reference to FIG. 9.

Next, board carry-in and transport operation in the board transporter of third component mounting device MC8 will be described with reference to FIGS. 4A to 8B. In the embodiment, as board carry-in and transport operation modes, a normal production mode (first operation mode), a board reverse carry-in mode (second operation mode), and a board reverse transport mode (third operation mode) are set in advance.

The normal production mode (first operation mode) is an operation mode of the board transport at the time of normal production in which a component is mounted while boards 14 are sequentially transported along board transport lines LA and LB. The board reverse carry-in mode (second operation mode) is an operation mode in which board 14 introduced in the downstream of the work station performing the component mounting work is moved to the upstream side and is carried in the work station. The board reverse transport mode (third operation mode) is an operation mode of a case where board 14 to be target introduced in the downstream of the work station of third component mounting device MC8 passes through third component mounting device MC8 and is transported up to the upstream device.

Figure 4A:
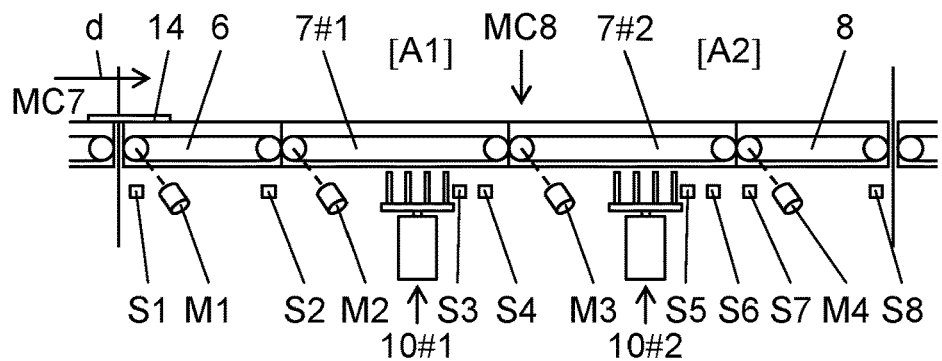
FIG. 4A is an operation explanatory view of a board carry-in operation in the component mounting system of an embodiment of the disclosure.

First, the normal production mode (first operation mode) will be described with reference to FIGS. 4A to 5C. As illustrated in FIG. 4A, when board 14 is delivered from the upstream device to carry-in conveyor 6 (arrow d), board 14 is detected by board detection sensor 51. Receiving the detection result, conveyor driving motor M1 is driven in the forward rotation direction that is a direction in which board 14 is sent to the downstream side. In this case, since boards 14 are not yet present in work stations [A1] and [A2], conveyor driving motors M2 and M3 are also driven to send board 14 to a range (here, work station [A2]) in which the board can be sent.

Figure 4B:
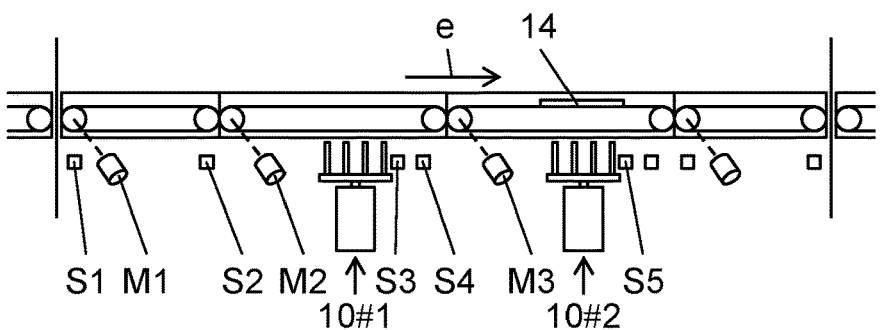
FIG. 4B is an operation explanatory view of the board carry-in operation in the component mounting system of an embodiment of the disclosure.

Next, as illustrated in FIG. 4B, board 14 is transported (arrow e) to the downstream in third component mounting device MC8. In the transport process, when it is confirmed that board 14 is discharged from carry-in conveyor 6 by board detection sensor S2, conveyor driving motor M1 stops. Similarly, when it is confirmed that board 14 is discharged from work station conveyor 7#1 by board detection sensor S4, conveyor driving motor M2 stops. When board 14 reaches work station [A2] and is detected by board detection sensor S5, conveyor driving motor M3 stops.

Figure 4C:
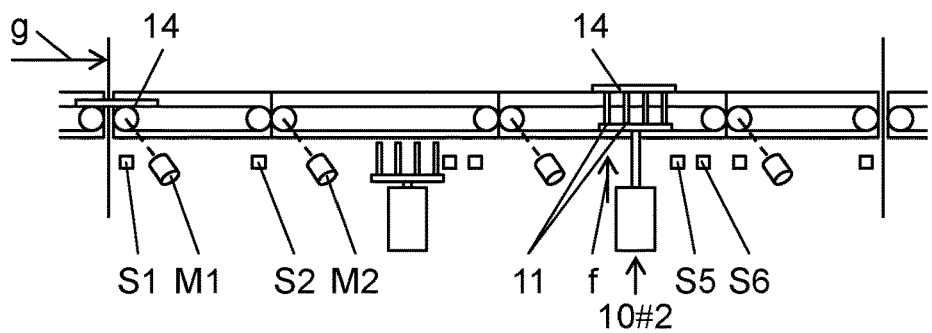
FIG. 4C is an operation explanatory view of the board carry-in operation in the component mounting system of an embodiment of the disclosure.

Next, as illustrated in FIG. 4C, after overrun of board 14 is not confirmed by board detection sensor S6, lower receiving pin 11 is raised (arrow f) in board lower receiver 10#2 and board 14 is held by work station [A2]. Concurrently with this operation, new board 14 is delivered (arrow g) from the upstream device to carry-in conveyor 6 and is detected by board detection sensor 51. Receiving the detection result, conveyor driving motor M1 is driven in the forward rotation direction. In this case, since board 14 is not yet present in work station [A1], conveyor driving motor M2 is also driven to send board 14 to a range (here, work station [A1]) in which the board can be sent.

Figure 4D:
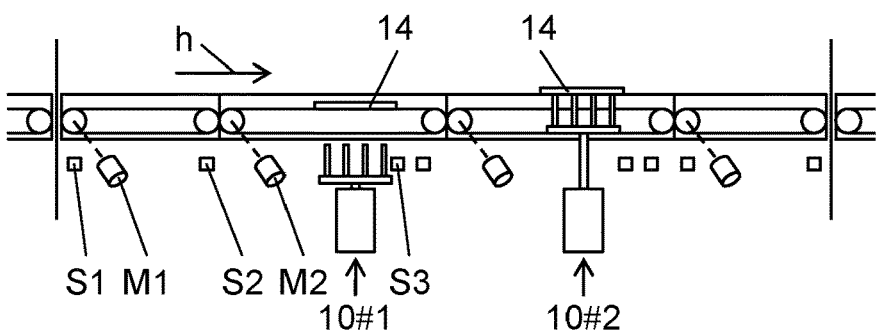
FIG. 4D is an operation explanatory view of the board carry-in operation in the component mounting system of an embodiment of the disclosure.
Figure 4E:
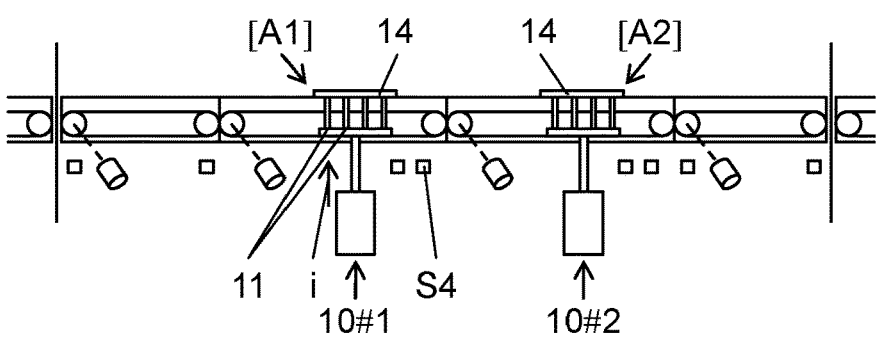
FIG. 4E is an operation explanatory view of the board carry-in operation in the component mounting system of an embodiment of the disclosure.

Next, as illustrated in FIG. 4D, new board 14 is transported (arrow h) to the downstream in third component mounting device MC8. In the transport process, when it is confirmed that board 14 is discharged from carry-in conveyor 6 by board detection sensor S2, conveyor driving motor M1 stops. When board 14 reaches work station [A1] and is detected by board detection sensor S3, conveyor driving motor M2 stops. Thereafter, as illustrated in FIG. 4E, after overrun of board 14 is not confirmed by board detection sensor S4, lower receiving pin 11 is raised (arrow i) in board lower receiver 10#1 and board 14 is held by work station [A1].

Figure 5A:
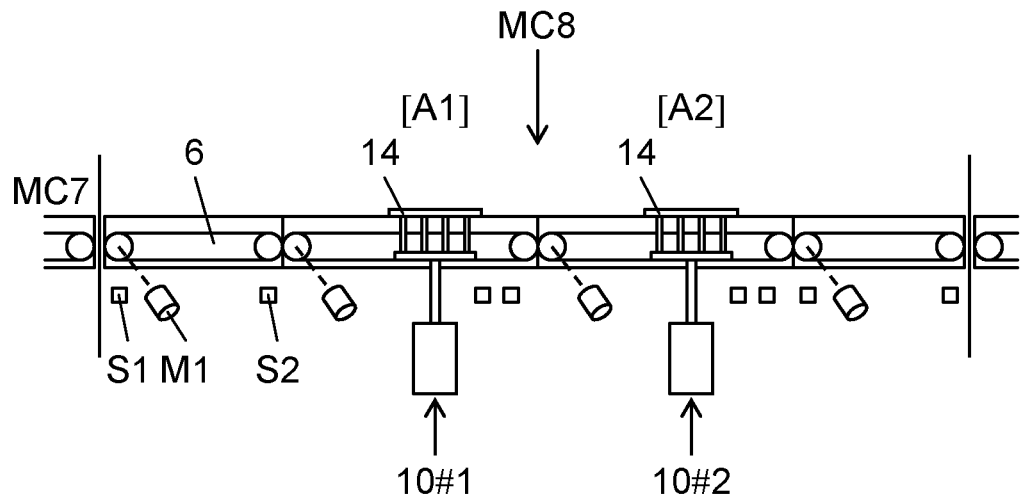
FIG. 5A is an operation explanatory view of the board carry-in operation in the component mounting system of an embodiment of the disclosure.

Therefore, as illustrated in FIG. 5A, work stations [A1] and [A2] of the relevant device are in a state of holding board 14. The component mounting work by component mounting head 9#1 and component mounting head 9#2 is started for boards 14 as a target held by work stations [A1] and [A2]. In this case, board 14 is not present in carry-in conveyor 6 and it is in a state capable of receiving new board 14. In this case, a "ready" signal indicating that the board can be received on the upstream side is transmitted to second component mounting device MC7 via communicator 17 (see FIG. 9).

Figure 5B:
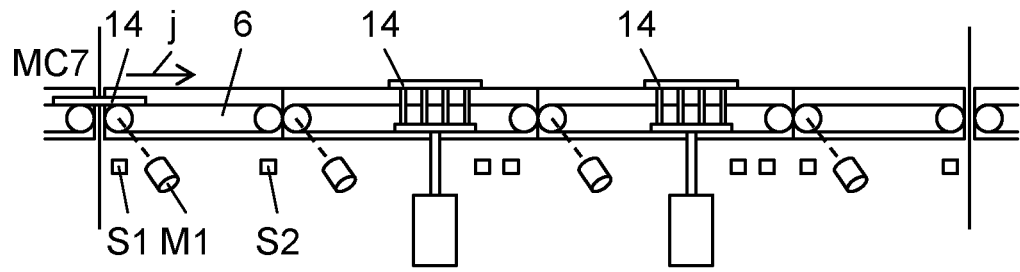
FIG. 5B is an operation explanatory view of the board carry-in operation in the component mounting system of an embodiment of the disclosure.
Figure 5C:
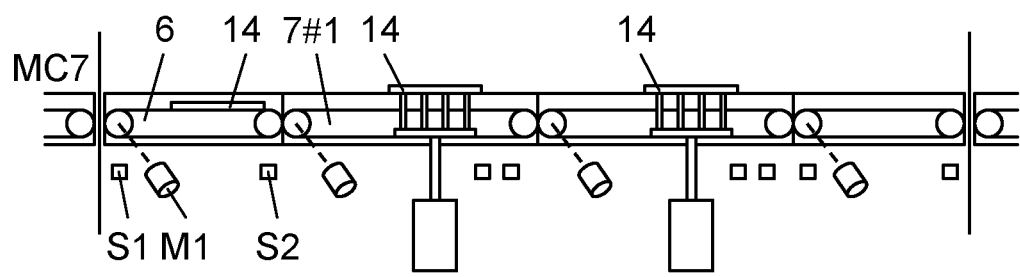
FIG. 5C is an operation explanatory view of the board carry-in operation in the component mounting system of an embodiment of the disclosure.

Receiving the "ready" signal, as illustrated in FIG. 5B, new board 14 is delivered (arrow j) from second component mounting device MC7 on the upstream side to carry-in conveyor 6 and is detected by board detection sensor S1. Receiving the detection result, conveyor driving motor M1 is driven in the forward rotation direction. As illustrated in FIG. 5C, when board 14 is detected by board detection sensor S2, driving of conveyor driving motor M1 is stopped.

Thereafter, board 14 waits in carry-in conveyor 6 until the component mounting work is completed in work stations [A1] and [A2], and board 14 is carried out from work station conveyor 7#1 to the downstream side. During this time, a "busy" signal indicating that new board 14 cannot be received by third component mounting device MC8 is transmitted to second component mounting device MC7 on the upstream side, and receiving of board 14 in third component mounting device MC8 is prohibited.

As described above, in the normal production mode (first operation mode), the board transporter transports boards 14 received from second component mounting device MC7 that is the upstream device to work stations [A1] and [A2] in which the component mounting work is performed. When mounting of the component on board 14 in work stations [A1] and [A2] is completed, board 14 on which the component is mounted is delivered from work stations [A1] and [A2] to another downstream device.

Figure 6A:
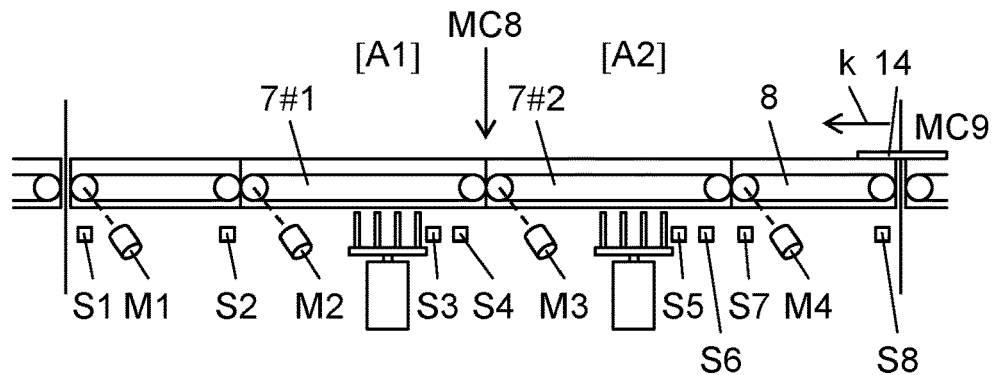
FIG. 6A is an operation explanatory view of a board reverse carry-in operation in the component mounting system of an embodiment of the disclosure.

Next, the board reverse carry-in mode (second operation mode) in the board transporter of third component mounting device MC8 will be described with reference to FIGS. 6A to 6D. First, a worker introduces board 14 to the downstream device (here, connecting conveyor MC9) of third component mounting device MC8. As illustrated in FIG. 6A, board 14 is delivered (arrow k) from the downstream device to carry-out conveyor 8, and is detected by board detection sensor S8. Receiving the detection result, conveyor driving motor M4 is driven in the reverse rotation direction that is a direction in which board 14 is sent to the upstream side. In this case, since boards 14 are not yet present in work stations [A2] and [A1], conveyor driving motors M2 and M3 are also driven to send board 14 to a range (here, work station [A1]) in which the board can be sent.

Figure 6B:
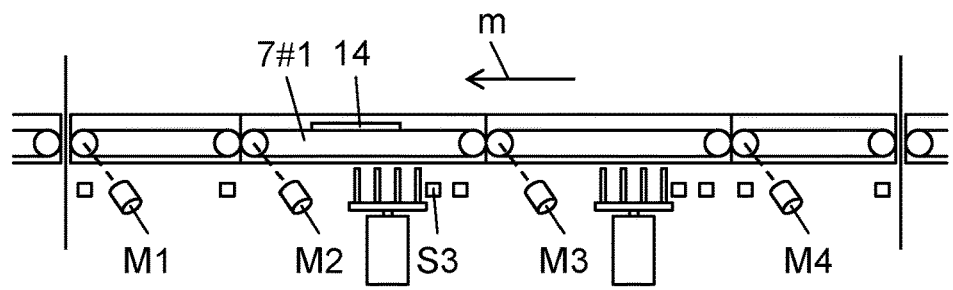
FIG. 6B is an operation explanatory view of the board reverse carry-in operation in the component mounting system of an embodiment of the disclosure.

Next, as illustrated in FIG. 6B, board 14 is transported (arrow m) to the upstream in third component mounting device MC8. In the transport process, when it is detected by board detection sensor S3 that board 14 is reversely carried in work station conveyor 7#1, conveyor driving motors M2, M3, and M4 stop. Therefore, board 14 is in a state of being stopped at a position on the upstream side of board detection sensor S3 in work station conveyor 7#1.

Figure 6C:
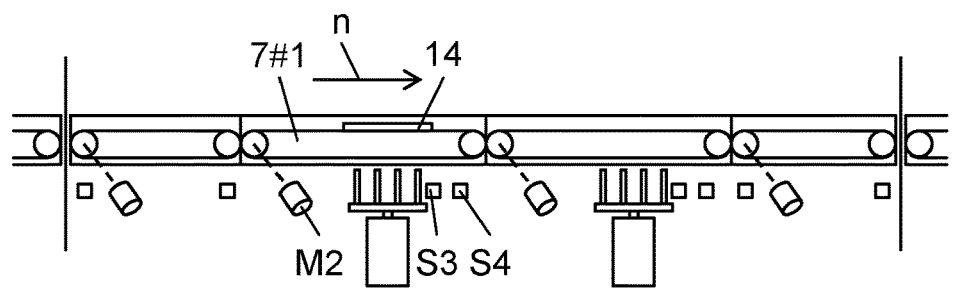
FIG. 6C is an operation explanatory view of the board reverse carry-in operation in the component mounting system of an embodiment of the disclosure.
Figure 6D:
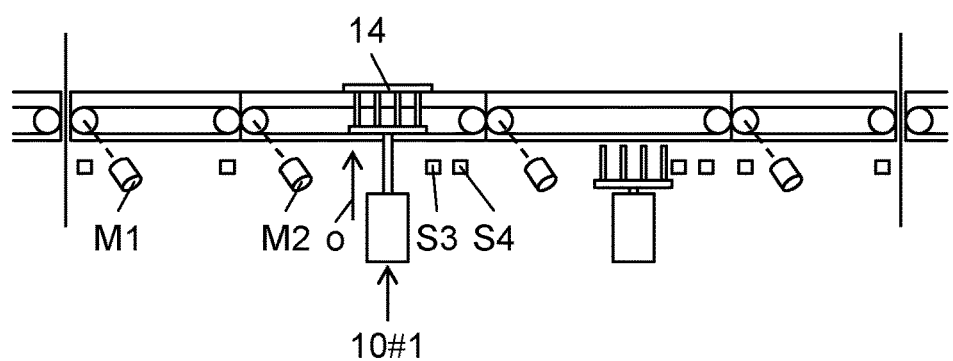
FIG. 6D is an operation explanatory view of the board reverse carry-in operation in the component mounting system of an embodiment of the disclosure.

Next, as illustrated in FIG. 6C, conveyor driving motor M2 is driven in the forward rotation direction and moves (arrow n) board 14 to the downstream side. When board 14 is detected by board detection sensor S3, conveyor driving motor M2 is stopped and board 14 is stopped at the stop position in work station [A1]. Next, as illustrated in FIG. 6D, after it is confirmed by board detection sensor S4 that overrun of board 14 does not occur, board lower receiver 10#1 is raised (arrow o). Therefore, work station [A1] is in a state of holding board 14.

As described above, in component mounting devices MC6 to MC9 including at least one board transporter constituting a part of board transport lines LA and LB for transporting board 14 from the upstream to the downstream, and the component mounting head for mounting the component on board 14 in the work station in the middle of the board transporter, a board transport method is configured of the following operation steps.

First, board 14 introduced in the downstream of the work station is transported by the board transporter to the work station in which mounting of the component is performed. In the work station, board 14 is transported by the board transporter further to the upstream of the stop position that is set in the work station. As the stop position, board detection sensor S3 and board detection sensor S5 illustrated in FIG. 3, a mechanical stopper disposed in place of the optical sensors, or the like may be used. Next, board 14 is transported to the downstream by the board transporter and is stopped at the stop position. Therefore, in the transport in the reverse direction from the downstream to the upstream, board 14 can be aligned in a correct stop position.

Next, similar to the above description, the board reverse carry-in mode (second operation mode) in the board transporter of third component mounting device MC8 will be described with reference to FIGS. 7A to 7D. In a board reverse carry-in operation illustrated here, an operation in which board 14 introduced in the downstream device is carried in work station [A2] is illustrated.

Figure 7A:
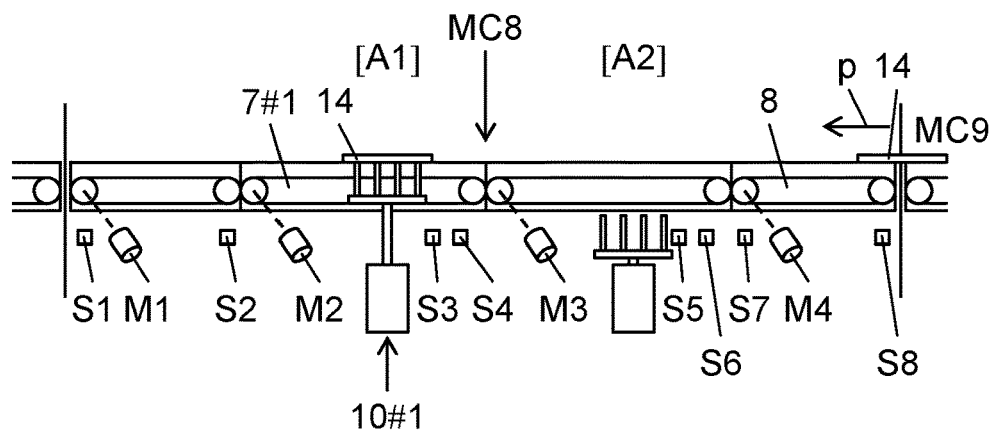
FIG. 7A is an operation explanatory view of the board reverse carry-in operation in the component mounting system of an embodiment of the disclosure.

First, board 14 is introduced in the downstream device (here, connecting conveyor MC9) of third component mounting device MC8. As illustrated in FIG. 7A, board 14 is delivered (arrow p) from the downstream device to carry-out conveyor 8 and is detected by board detection sensor S8. Receiving the detection result, conveyor driving motor M4 is driven in the reverse rotation direction that is a direction in which board 14 is sent to the upstream side. In this case, since board 14 is not yet present in work station [A2], conveyor driving motor M3 is also driven to send board 14 to a range (here, work station [A2]) in which the board can be sent.

Figure 7B:
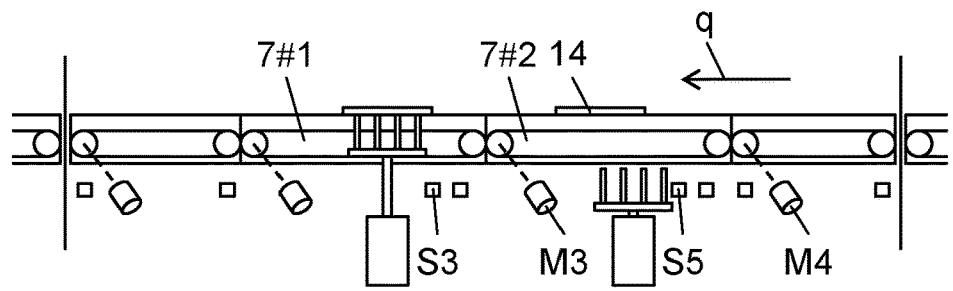
FIG. 7B is an operation explanatory view of the board reverse carry-in operation in the component mounting system of an embodiment of the disclosure.

Next, as illustrated in FIG. 7B, board 14 is transported (arrow q) to the upstream in third component mounting device MC8. In the transport process, when it is detected by board detection sensor S5 that board 14 is reversely carried in work station conveyor 7#2, conveyor driving motor M3 stops. Therefore, board 14 is in a state of being stopped at a position on the upstream side of board detection sensor S5 in work station conveyor 7#2.

Figure 7C:
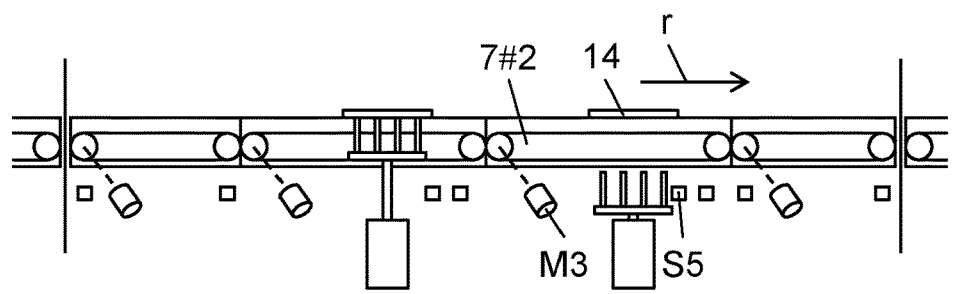
FIG. 7C is an operation explanatory view of the board reverse carry-in operation in the component mounting system of an embodiment of the disclosure.
Figure 7D:
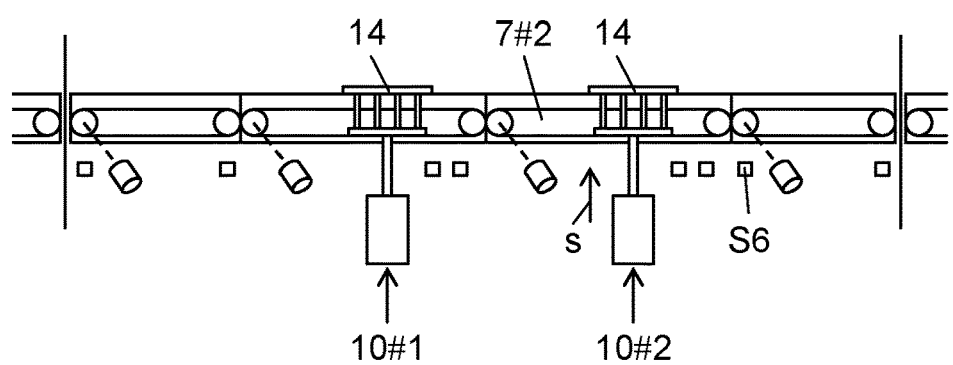
FIG. 7D is an operation explanatory view of the board reverse carry-in operation in the component mounting system of an embodiment of the disclosure.

Next, as illustrated in FIG. 7C, conveyor driving motor M3 is driven in the forward rotation direction and moves (arrow r) board 14 to the downstream side. When board 14 is detected by board detection sensor S5, conveyor driving motor M3 is stopped and board 14 is stopped at the stop position in work station [A2]. Next, as illustrated in FIG. 7D, after it is confirmed by board detection sensor S6 that overrun of board 14 does not occur, board lower receiver 10#2 is raised (arrow s).

Therefore, in addition to work station [A1] illustrated in FIGS. 6A to 6D, third component mounting device MC8 is also in a state of holding board 14 in work station [A2]. In this state, predetermined component mounting work is executed for boards 14 as a target held by work stations [A1] and [A2].

In the embodiment, board 14 is prohibited from carrying in the work station from the upstream side of the work station until board 14 is carried in the work station in which the component mounting work on board 14 is performed by the second operation mode. Even in a case where it is necessary to send the board to the work station of third component mounting device MC8 with the second operation mode, it is possible to execute the board transport operation for supplying a required board without stopping normal operation of entire component mounting system 1 by adopting such a board transport control.

In the board reverse carry-in operation illustrated in the embodiment, as a position at which the worker introduces board 14 to board transport line LA (lane A), connecting conveyor MC9 which is positioned on the downstream of third component mounting device MC8 is used. Since connecting conveyor MC9 has a simple internal mechanism and there is no component supplier attached to a side as the component mounting device, introduction of board 14 to board transport line LA (lane A) can be easily performed with good workability.

Board 14, which is carried in a predetermined work station by the second operation mode and on which the component mounting work is completed, is discharged to the downstream by the board transport operation by the normal production mode (first operation mode). Instead of the method of discharging board 14 by the normal production mode (first operation mode), board 14, which is carried in the work station and on which mounting of the component is completed, may be carried out to the downstream by the board reverse carry-in mode (second operation mode). In this case, in addition to the operation of carry-in of board 14 from the downstream to the work station, the board reverse carry-in mode (second operation mode) includes the operation of carry-out of board 14 on which mounting of the component is completed from the work station.

Furthermore, after mounting of the component is completed in the work station, it may be set such that the operation mode is automatically switched from the second operation mode to the first operation mode. That is, in this case, the board transporter is configured such that after board 14 is carried in the work station by the second operation mode, the operation mode is automatically switched to the first operation mode and board 14 on which mounting of the component is completed is carried out to the downstream by the first operation mode.

As described above, it is possible to prevent troubles caused by the worker forgetting the switching operation to the first operation mode, for example, a long-term stoppage of the component mounting system or the like by adopting the automatic switching of the operation mode. Switching timing may be set immediately after board 14 is carried in the work station until the component mounting work is completed. Therefore, component mounting system 1 can be quickly restored to the normal production state.

Figure 8A:
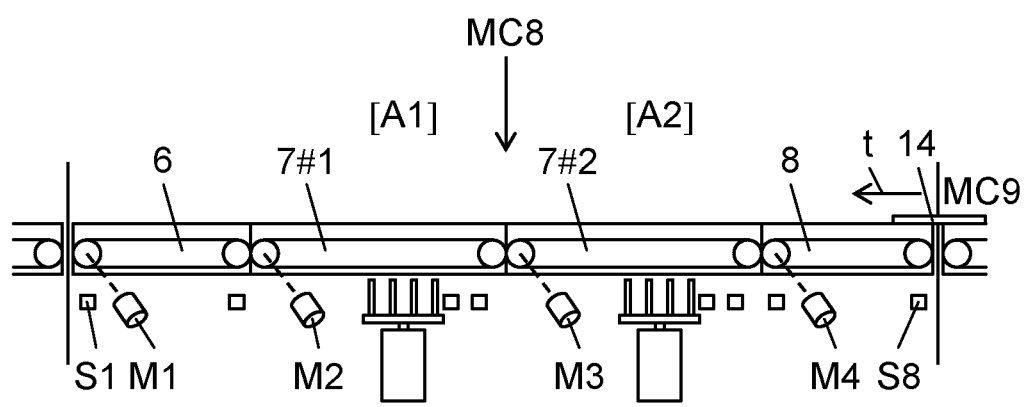
FIG. 8A is an operation explanatory view of a board reverse transport operation in the component mounting system of an embodiment of the disclosure.

Next, the board reverse transport mode (third operation mode) in the board transporter of third component mounting device MC8 will be described with reference to FIGS. 8A and 8B. First, board 14 is introduced in the downstream device (here, connecting conveyor MC9) of third component mounting device MC8. As illustrated in FIG. 8A, board 14 is delivered (arrow t) from the downstream device to carry-out conveyor 8 and is detected by board detection sensor S8. Receiving the detection result, conveyor driving motors M1, M2, M3, and M4 are driven in the reverse rotation direction that is a direction in which board 14 is sent to the upstream side. Therefore, board 14 is sequentially transported by carry-out conveyor 8, work station conveyor 7#2, work station conveyor 7#1, and carry-in conveyor 6 from the downstream side to the upstream side.

Figure 8B:
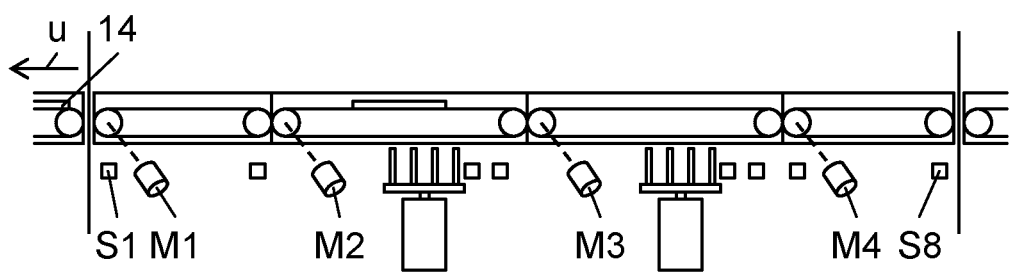
FIG. 8B is an operation explanatory view of the board reverse transport operation in the component mounting system of an embodiment of the disclosure.

As illustrated in FIG. 8B, when it is confirmed that board 14 passes through (arrow u) board detection sensor 51, conveyor driving motors M1, M2, M3, and M4 stop. Therefore, a board reverse transport for transporting board 14, which is introduced in the downstream device, to the upstream device by passing through third component mounting device MC8 is completed. That is, the board transporter has the third operation mode for transporting board 14, which is introduced in the downstream of the work station in the middle of the board transporter, to the upstream device.

In the board carry-in operation illustrated in FIGS. 4A to 5C, the board reverse transport operation illustrated in FIGS. 6A to 7D, and the board reverse transport operation illustrated in FIGS. 8A and 8B, the transport operation example of board 14 for work stations [A1] and [A2] in board transport line LA (lane A) is illustrated, but even in a case where work stations [B1] and [B2] in board transport line LB (lane B) are targeted, the same transport operation is executed.

Next, a configuration of a control system of first component mounting device MC6, second component mounting device MC7, and third component mounting device MC8 constituting component mounter 1b in component mounting system 1 will be described. Here, although only third component mounting device MC8 is described here, the same applies to first component mounting device MC6 and second component mounting device MC7.

Figure 9:
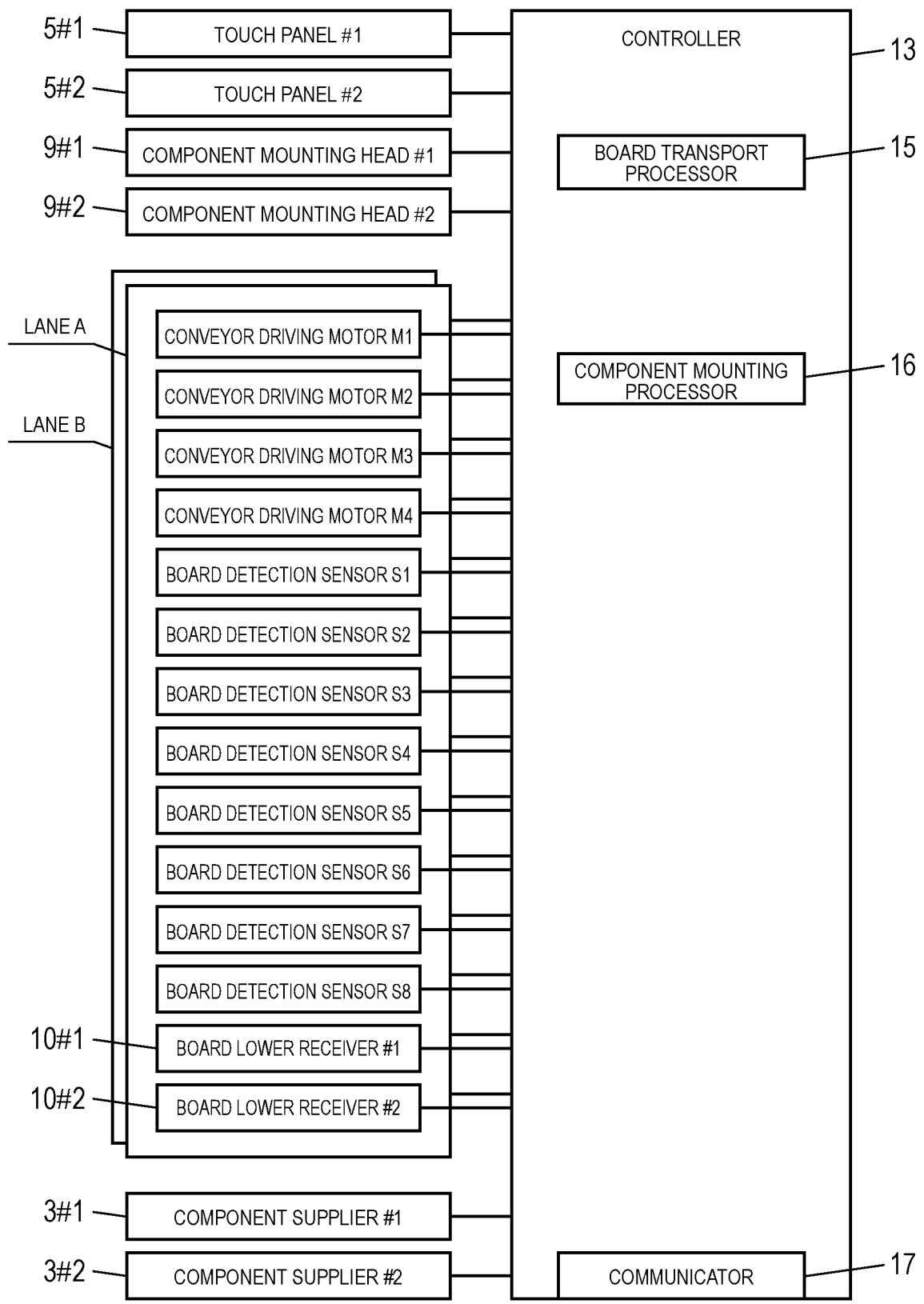
FIG. 9 is a block diagram illustrating a configuration of a control system of the component mounting system of an embodiment of the disclosure.

In FIG. 9, controller 13 is a control device included in third component mounting device MC8 and includes board transport processor 15, component mounting processor 16, and communicator 17 as an internal processing function. Board transport processor 15 performs a process relating to the transport and positioning of board 14 by the board transporter of third component mounting device MC8. In the process, the transport operation mode by the board transporter is selected by instruction input from touch panels 5#1 and 5#2. Board transport processor 15 controls conveyor driving motors M1 to M4 and board lower receivers 10#1 and 10#2 provided in each of board transport lines LA and LB based on the instruction input. The control is performed based on the board detection results by board detection sensors S1 to S8 described in FIG. 3.

Component mounting processor 16 controls the component mounting operation by component mounting heads 9#1 and 9#2. In this case, the control of the component supply operation by component suppliers 3#1 and 3#2 is also performed. Communicator 17 performs exchange of operation commands between the relevant device and a host system, and exchange of signals relating to delivery of the board between the relevant device, the downstream device, and the upstream device.

Figure 10:
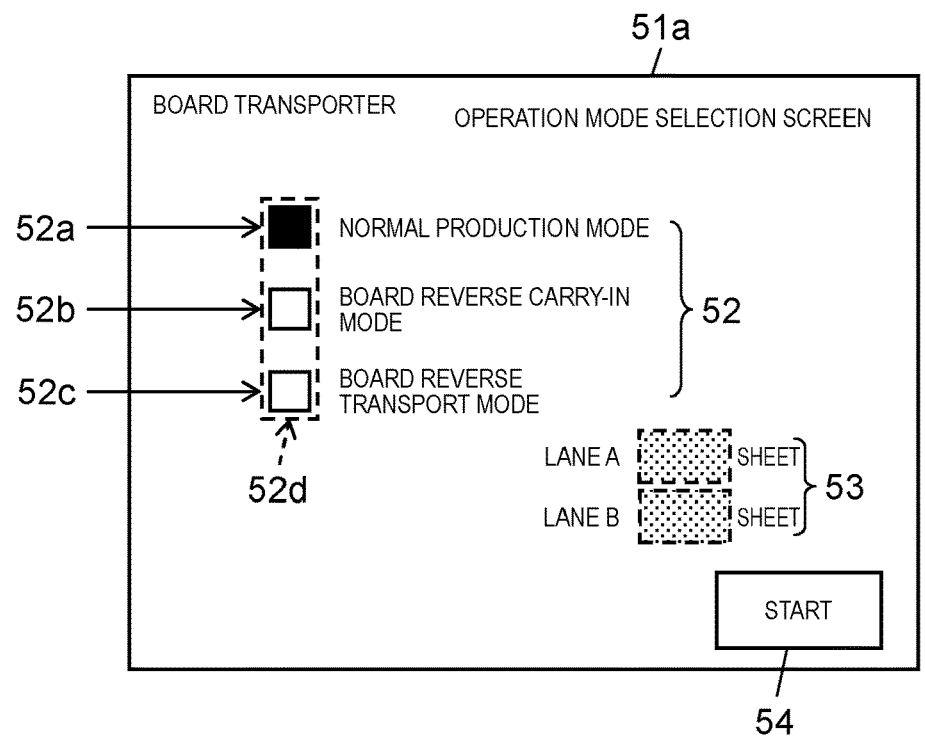
FIG. 10 is an explanatory view of an operation mode selection screen in board transport by the component mounting system of an embodiment of the disclosure.
Figure 11:
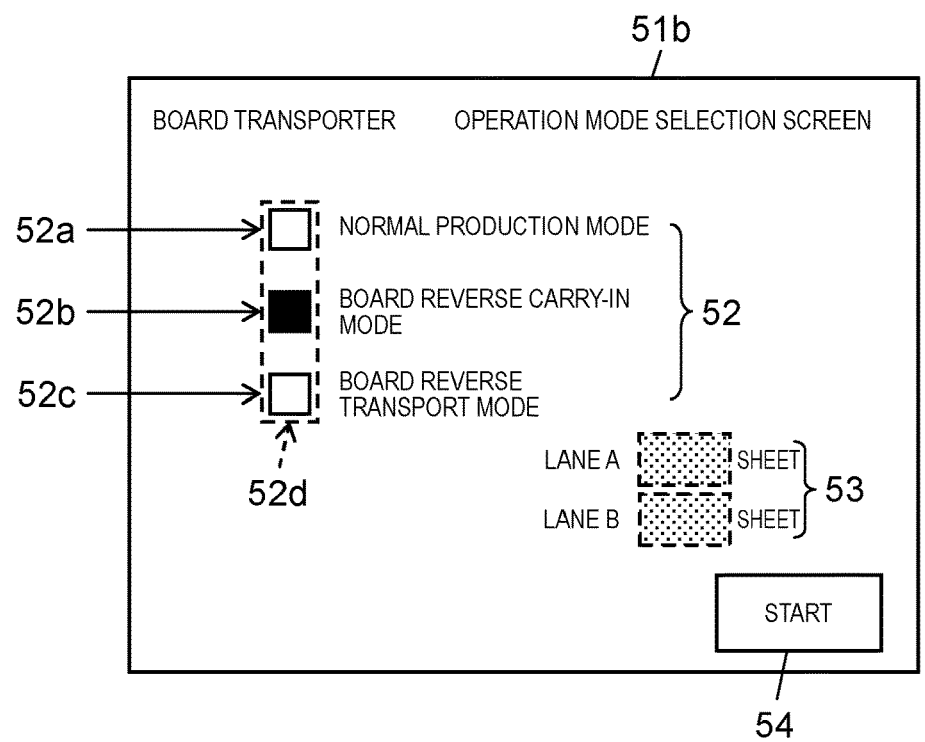
FIG. 11 is an explanatory view of the operation mode selection screen in board transport by the component mounting system of an embodiment of the disclosure.
Figure 12:
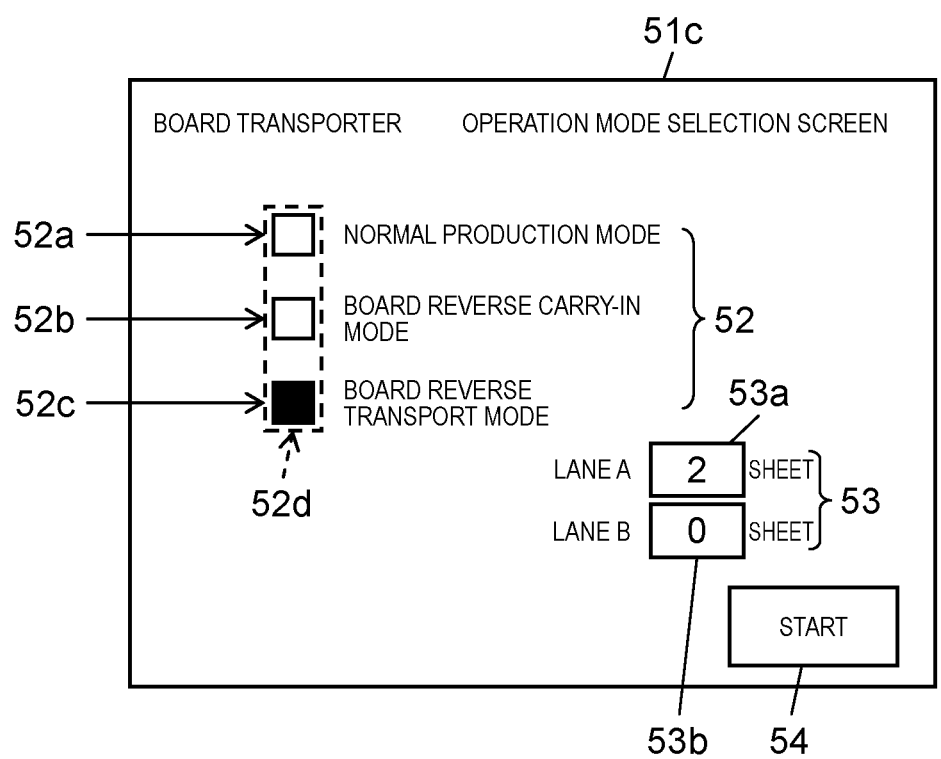
FIG. 12 is an explanatory view of the operation mode selection screen in board transport by the component mounting system of an embodiment of the disclosure.

Next, operation mode selection screens of the board transporter displayed on touch panels 5#1 and 5#2 will be described with reference to FIGS. 10 to 13B. Selection screens 51a, 51b, and 51c illustrated in FIGS. 10, 11, and 12 are the same as the screen configuration, and transport operation mode display column 52, board number input column 53, and start operation button 54 are set.

In transport operation mode display column 52, divisions of three operation modes which are set for the board carry-in transport operation in the board transporter are displayed together with selection frame 52d. These divisions are normal production mode 52a, board reverse carry-in mode 52b, and board reverse transport mode 52c, and respectively correspond to the first operation mode, the second operation mode, and the third operation mode. Upon selection of the operation mode, it is possible to select one of normal production mode 52a, board reverse carry-in mode 52b, and board reverse transport mode 52c by operating selection frame 52d which is set corresponding to each division.

Board number input column 53 is an input column for inputting in advance a planned number of sheets in a case where board reverse transport mode 52c is selected and the board reverse transport is executed. As illustrated in selection screen 51c of FIG. 12, board number input column 53 is active only in a case where board reverse transport mode 52c is selected, and input frames 53a and 53b for inputting a preset number of sheets for each lane are displayed. In selection screen 51c illustrated in FIG. 12, 2 and 0 are respectively input into input frames 53a and 53b. In selection screen 51a and selection screen 51b of a case where normal production mode 52a and board reverse carry-in mode 52b are selected, a function of board number input column 53 is stopped and input frames 53a and 53b are in a blind state. In any of the screens, the board transport operation is started with contents input into the relevant operation screen by operating start operation button 54.

Figure 13A:
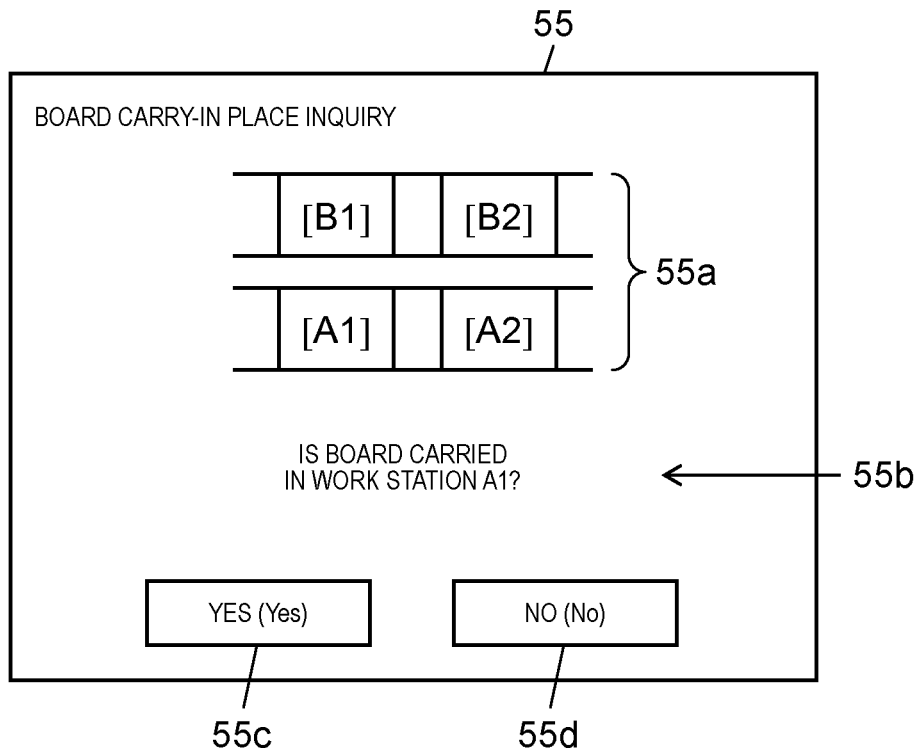
FIG. 13A is an explanatory view of a board carry-in place inquiry screen in board transport by the component mounting system of an embodiment of the disclosure.

Next, an inquiry about a board carry-in place which is executed in the board reverse carry-in mode (second operation mode) described above will be described with reference to FIGS. 13A and 13B. When board reverse carry-in mode 52b is selected in selection screen 51b illustrated in FIG. 11, inquiry screen 55 illustrated in FIG. 13A is displayed. Station arrangement display column 55a for abbreviating an arrangement of the work stations to be carried in and inquiry display column 55b for inquiring whether or not board is carried in a specific (here, A1) work station among the displayed work stations are displayed on inquiry screen 55.

Furthermore, Yes operation button 55c and No operation button 55d for inputting an answer to the inquiry of inquiry display column 55b are set on inquiry screen 55. Yes operation button 55c corresponds to an affirmative answer "Yes" and No operation button 55d corresponds to a negative answer "No".

Figure 13B:
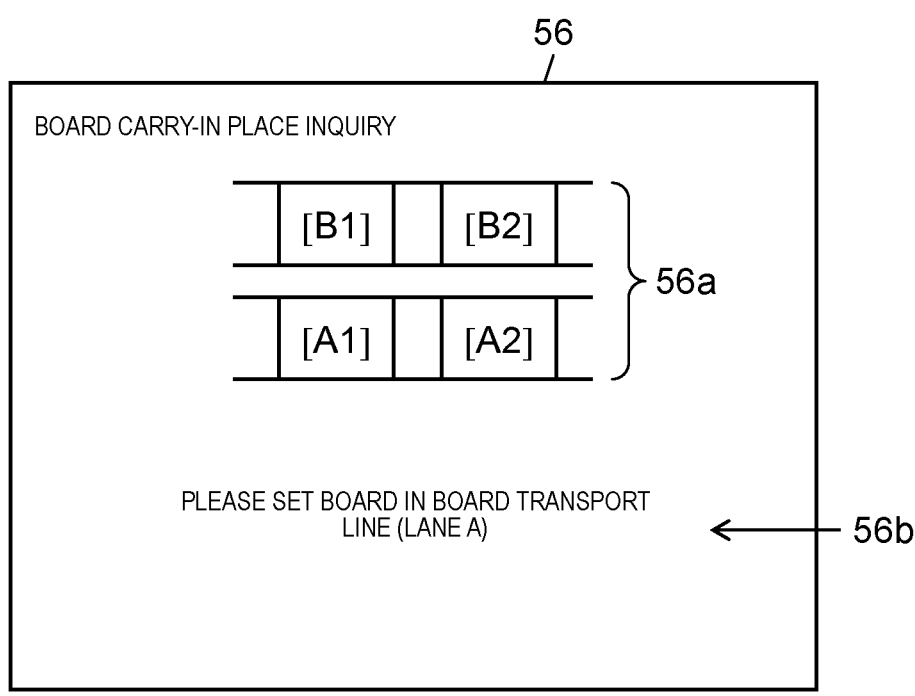
FIG. 13B is an explanatory view of the board carry-in place inquiry screen in board transport by the component mounting system of an embodiment of the disclosure.

Instruction screen 56 illustrated in FIG. 13B is displayed by operating Yes operation button 55c in inquiry screen 55. Station arrangement display column 56a similar to station arrangement display column 55a in inquiry screen 55 and instruction content display column 56b for prompting execution by instructing work contents required as a next work step are displayed on instruction screen 56. In the example illustrated here, execution of work of setting the board in board transport line LA (lane A) is instructed.

Next, the board reverse carry-in process executed for one component mounting device as a target disposed in component mounting system 1 will be described with reference to FIG. 14. The process is executed in a case where it is necessary to supply the board to the component mounting device to be target in order to perform work other than the normal production work such as manufacture of a test board for adjustment of the inspection device, trial mounting, and supplementary mounting of a lack component in component mounting system 1. Upon execution of the board reverse carry-in process, selection screen 51a illustrated in FIG. 10 is displayed on touch panels 5#1 and 5#2, the board reverse carry-in mode is selected on the screen, and start operation button 54 is operated to start.

First, setting is made to prohibit the board carry-in from the upstream facility (ST1). The setting is performed by transmitting the "busy" signal indicating that new board 14 cannot be received to the upstream facility. Next, a board reverse carry-in place inquiry is performed by displaying inquiry screen 55 illustrated in FIG. 13A (ST2). Here, first, an inquiry to the worker is performed for whether or not the board is carried in work station A1.

An answer to the inquiry is performed (ST3). The answer is performed by operating Yes operation button 55c or No operation button 55d by the worker on inquiry screen 55 illustrated in FIG. 13A. Here, in a case where Yes operation button 55c is operated, the board reverse carry-in is executed for work station A1 as a target (ST4). In (ST3), when No operation button 55d is operated, the process skips (ST4) and proceeds to the next step.

In the next step, similar to (ST2), the board carry-in place inquiry is performed for work station A2 as a target (ST5). Similarly, an answer to the inquiry is performed (ST6). Similarly, in a case where an answer indicating Yes is performed, the board reverse carry-in is executed for work station A2 as a target (ST7). In addition, in (ST6), in a case where an answer indicating No is performed, the process skips (ST7) and proceeds to the next step.

In the next step, similar to (ST2), the board carry-in place inquiry is performed for work station B1 as a target (ST8). Similarly, an answer to the inquiry is performed (ST9). Similarly, in a case where an answer indicating Yes is performed, the board reverse carry-in is executed for work station B1 as a target (ST10). In addition, in (ST9), in a case where an answer indicating No is performed, the process skips (ST10) and proceeds to the next step.

In the next step, similar to (ST2), the board carry-in place inquiry is performed for work station B2 as a target (ST11). Similarly, an answer to the inquiry is performed (ST12). Similarly, in a case where an answer indicating Yes is performed, the board reverse carry-in is executed for work station B2 as a target (ST13). In addition, in (ST12), in a case where an answer indicating No is performed, the process skips (ST13) and proceeds to the next step.

Next, the board transport mode is changed and the board reverse carry-in mode (second operation mode) is changed to the normal production mode (first operation mode) (ST14). Next, the board carry-in prohibition is released (ST15). That is, the "busy" signal which is transmitted to the upstream facility is released and instead thereof, the "busy" signal or the "ready" signal is transmitted based on the normal production mode. Therefore, the board reverse carry-in process is completed and the operation returns to the normal operation (ST16).

Figure 18:
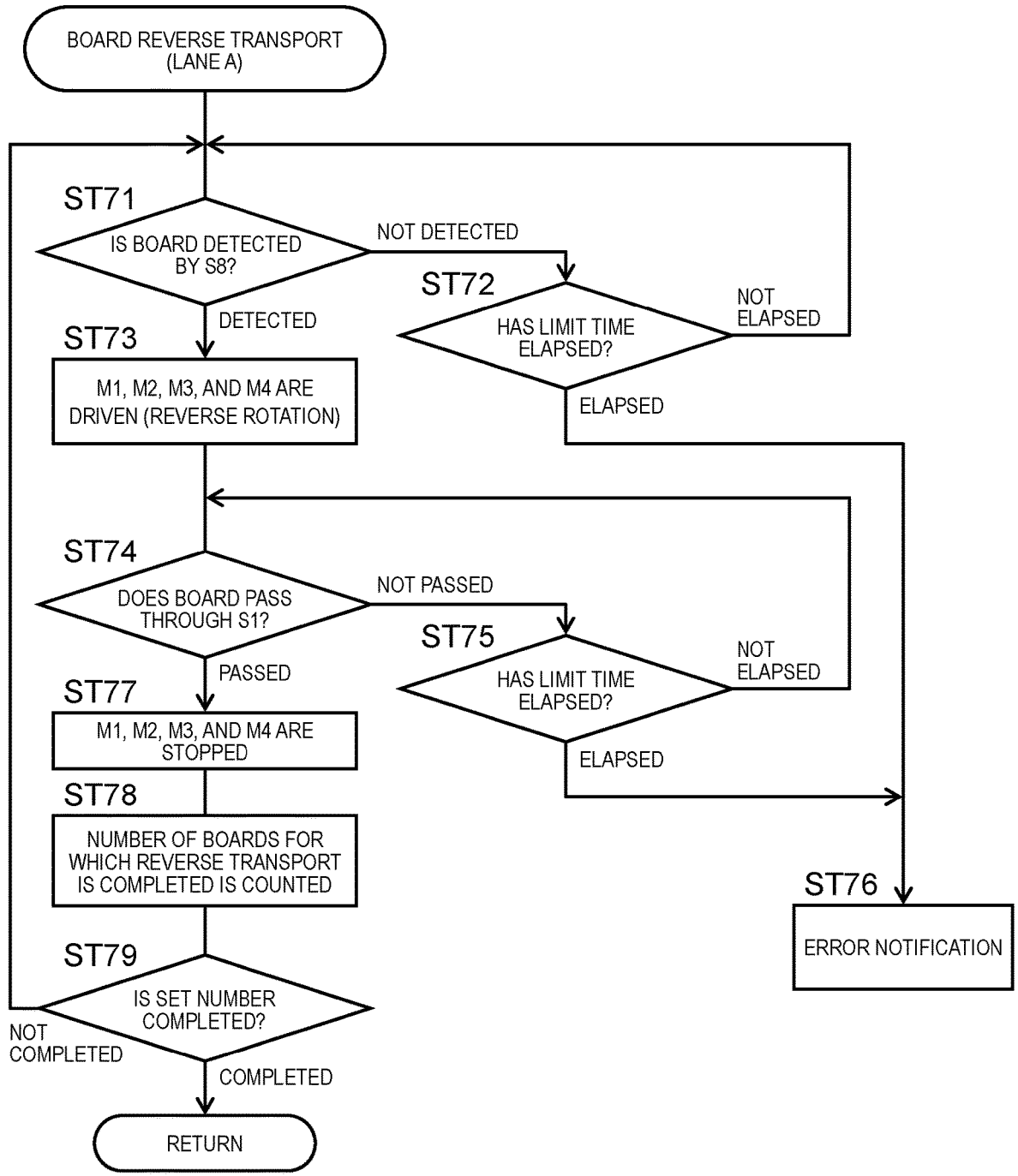
FIG. 18 is a flowchart illustrating the board reverse transport process in the component mounting system of an embodiment of the disclosure.

Next, a detailed flow of (ST4) in the flow of FIG. 14 described above will be described with reference to FIG. 15. The flow corresponds to the operation description illustrated in FIGS. 6A to 6D. Here, in the description of board detection sensor S1 to board detection sensor S8, and conveyor driving motor M1 to conveyor driving motor M4, for the sake of simplicity, only symbols S1 to S8 and M1 to M4 are described by omitting the names. The same applies to FIGS. 16 and 18.

First, the worker introduces board 14 to board transport line LA (lane A) in accordance with the instruction displayed in instruction content display column 56b of instruction screen 56 illustrated in FIG. 13B. It is determined whether or not introduced board 14 is detected by board detection sensor S8 (ST21). Here, if it is not detected, it is confirmed whether or not a preset limit time has elapsed since the introduction of board 14 (ST22). Here, if the limit time has not elapsed, the process returns to (ST21), the board detection is continuously monitored, and in a case where the limit time has elapsed, the process proceeds to (ST31) to perform error notification.

In (ST21), in a case where board 14 is detected, conveyor driving motors M2, M3, and M4 are driven in the reverse rotation direction (ST23). Therefore, board 14 moves to the upstream side and in the movement process, it is detected whether or not board has already passed by board detection sensor S3 (ST24). Here, if it has not passed, it is confirmed whether or not the preset limit time has elapsed since the board detection by board detection sensor S8 (ST25).

Here, if the limit time has not elapsed, the process returns to (ST24) and the board detection is monitored. If the limit time has elapsed, the process proceeds to (ST31) to perform error notification. In (ST24), when it is confirmed that board 14 has passed, it is determined that further board transport is unnecessary and the rotation of conveyor driving motors M2, M3, and M4 is stopped (ST26).

Next, in order to position board 14 at the correct stop position, conveyor driving motor M2 is driven in the forward rotation direction (ST27). Therefore, board 14 moves to the downstream side and in the movement process, it is monitored whether or not board is detected by board detection sensor S3 (ST28). Here, if it is not detected, it is confirmed whether or not the preset limit time has elapsed since the board detection by board detection sensor S3 (ST29). Here, if the limit time has not elapsed, the process returns to (ST28) and the board detection is monitored. If the limit time has elapsed, the process proceeds to (ST31) to perform error notification.

In (ST28), in a case where board 14 is detected, it is confirmed of presence or absence of overrun of board 14 by confirming whether or not board 14 is detected by board detection sensor S3 (ST30). Here, in a case where board detection sensor S3 detects board 14 and occurrence of overrun is detected, the process proceeds to (ST31) to perform error notification. In (ST30), in a case where it is confirmed that there is no overrun, board lower receiver 10#1 is raised, and lower-supports and lifts board 14. Therefore, board 14 of the carry-in target is held by work station [A1], the board reverse carry-in operation for work station [A1] as a target is completed, and the process returns to a main operation flow.

Next, a detailed flow of (ST7) in the flow of FIG. 14 will be described with reference to FIG. 16. The flow corresponds to the operation description illustrated in FIGS. 7A to 7D. First, the worker introduces board 14 to board transport line LA (lane A) in accordance with instruction content display column 56b of instruction screen 56 illustrated in FIG. 13B. It is determined whether or not introduced board 14 is detected by board detection sensor S8 (ST41). Here, if it is not detected, it is confirmed whether or not the preset limit time has elapsed since the introduction of board 14 (ST42). Here, if the limit time has not elapsed, the process returns to (ST41), the board detection is continuously monitored, and in a case where the limit time has elapsed, the process proceeds to (ST51) to perform error notification.

In (ST41), in a case where board 14 is detected, conveyor driving motors M3 and M4 are driven in the reverse rotation direction (ST43). Therefore, board 14 moves to the upstream side and in the movement process, it is detected whether or not board has already passed by board detection sensor S5 (ST44). Here, if it has not passed, it is confirmed whether or not the preset limit time has elapsed since the board detection by board detection sensor S8 (ST45).

Here, if the limit time has not elapsed, the process returns to (ST44) and the board detection is monitored. If the limit time has elapsed, the process proceeds to (ST51) to perform error notification. In (ST44), when it is confirmed that board 14 has passed, it is determined that further board transport is unnecessary and the rotation of conveyor driving motors M3 and M4 is stopped (ST46).

Next, in order to position board 14 at the correct stop position, conveyor driving motor M3 is driven in the forward rotation direction (ST47). Therefore, board 14 moves to the downstream side and in the movement process, it is monitored whether or not board is detected by board detection sensor S5 (ST48). Here, if it is not detected, it is confirmed whether or not the preset limit time has elapsed since the board detection by board detection sensor S5 (ST49). Here, if the limit time has not elapsed, the process returns to (ST48) and the board detection is monitored. If the limit time has elapsed, the process proceeds to (ST51) to perform error notification.

In (ST48), in a case where board 14 is detected, it is confirmed of presence or absence of overrun of board 14 by confirming whether or not board 14 is detected by board detection sensor S6 (ST50). Here, in a case where board detection sensor S3 detects board 14 and occurrence of overrun is detected, the process proceeds to (ST51) to perform error notification. In (ST50), in a case where it is confirmed that there is no overrun, board lower receiver 10#2 is raised, and lower-supports and lifts board 14. Therefore, board 14 of the carry-in target is held by work station [A2], the board reverse carry-in operation for work station [A2] as a target is completed, and the process returns to the main operation flow.

Figure 14:
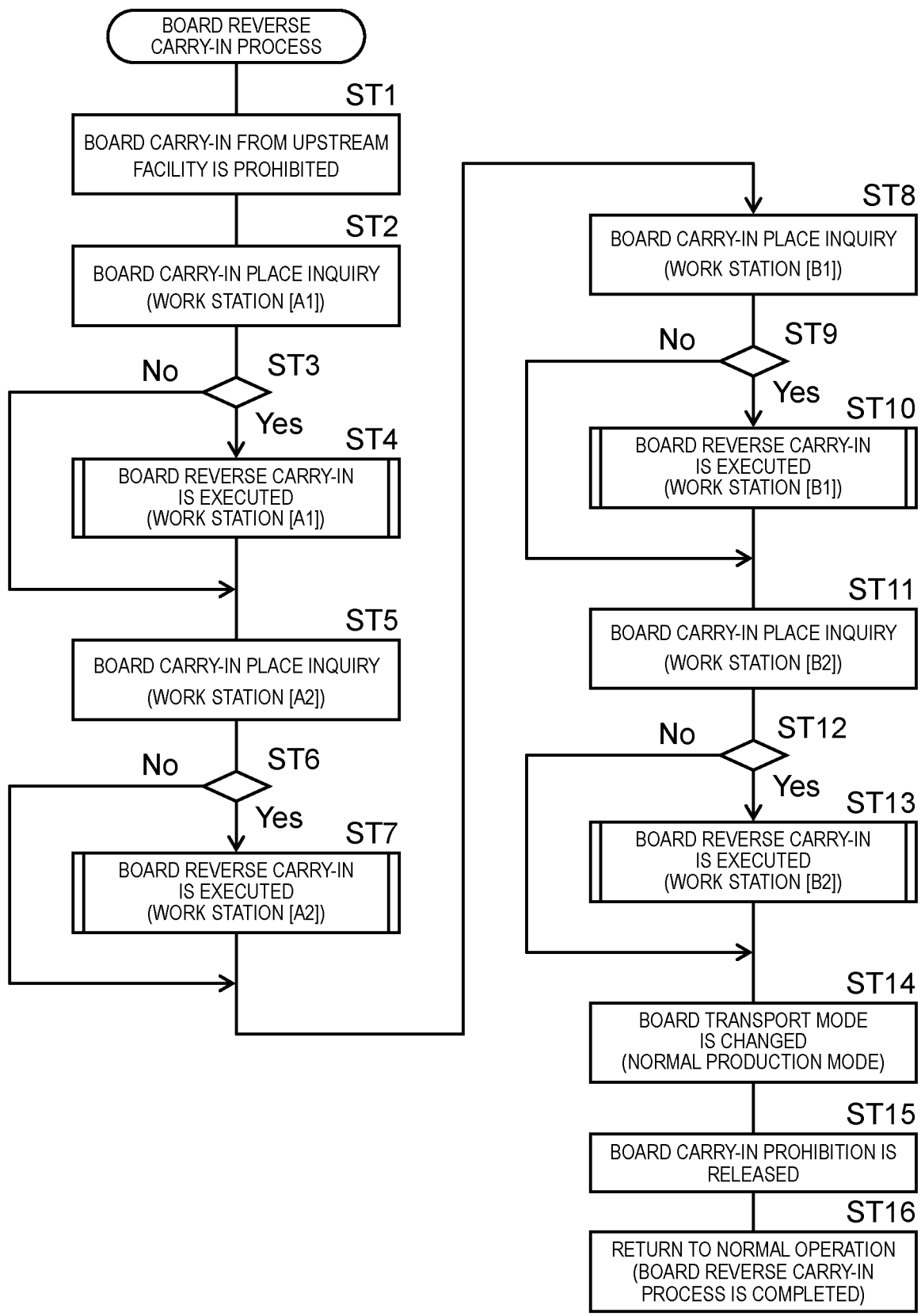
FIG. 14 is a flowchart illustrating a board reverse carry-in process in the component mounting system of an embodiment of the disclosure.
Figure 15:
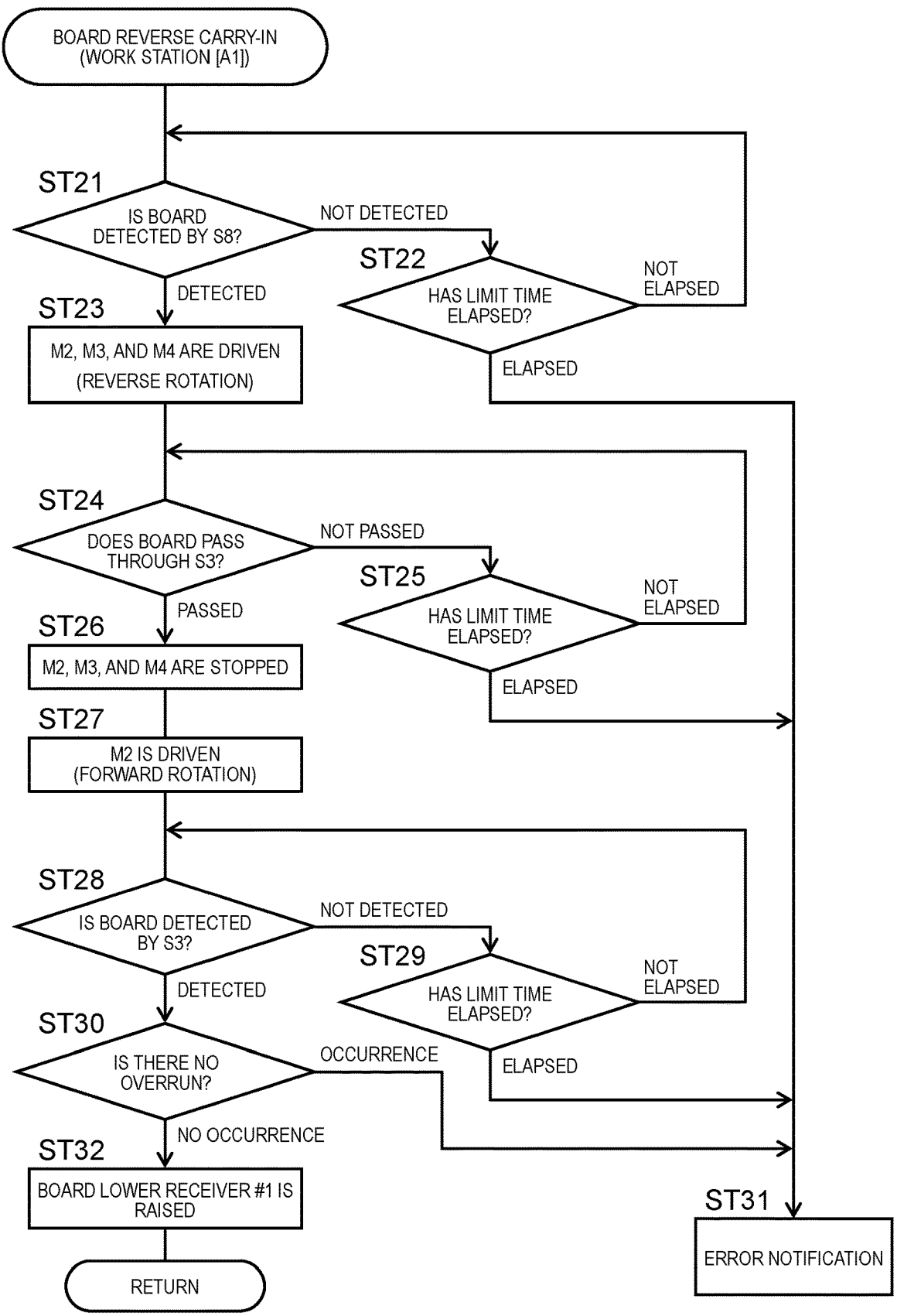
FIG. 15 is a flowchart illustrating the board reverse carry-in process in the component mounting system of an embodiment of the disclosure.
Figure 16:
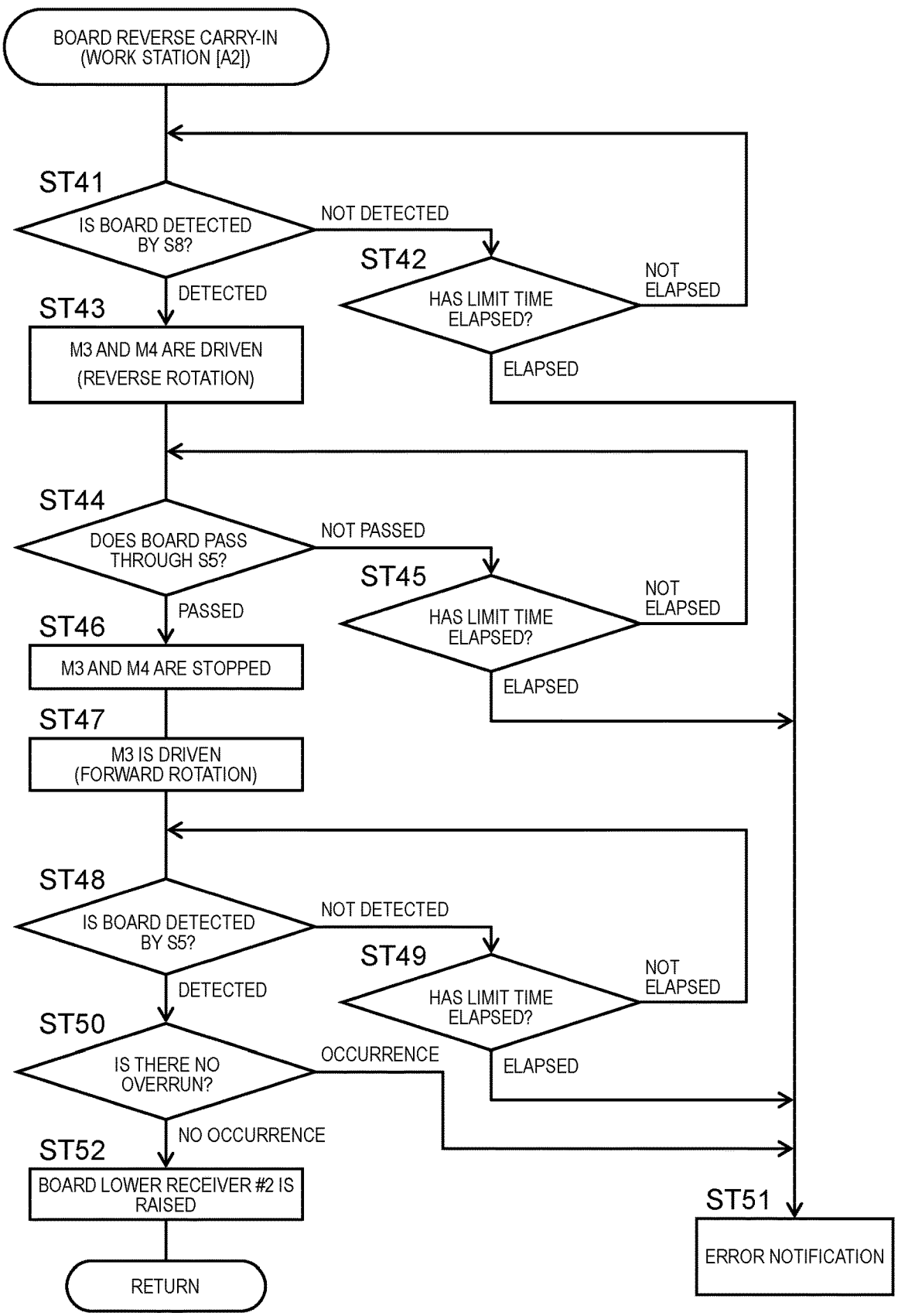
FIG. 16 is a flowchart illustrating the board reverse carry-in process in the component mounting system of an embodiment of the disclosure.

Thereafter, the board reverse carry-in process illustrated in (ST8) to (ST13) of FIG. 14, that is, the board reverse carry-in process with work stations [B1] and work station [B2] of board transport line LB as the carry-in target is executed similar to the process illustrated in FIGS. 15 and 16. Thereafter, the process returns to (ST14) in the flow of FIG. 14.

Figure 17:
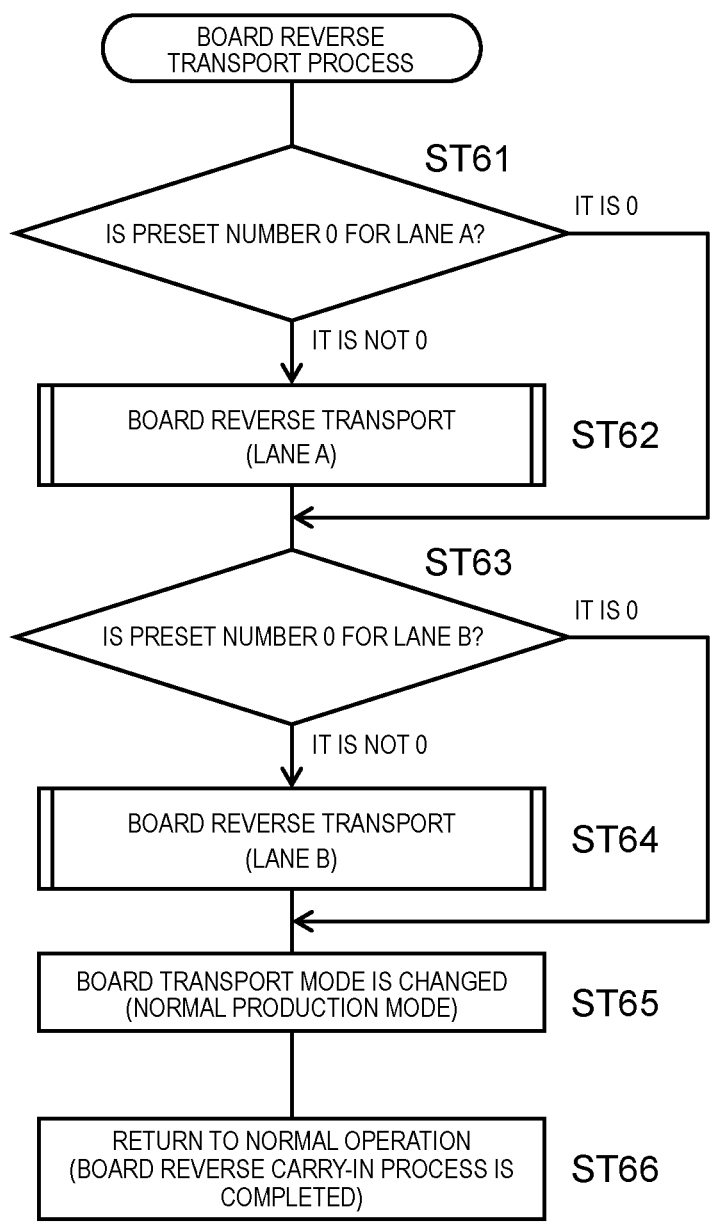
FIG. 17 is a flowchart illustrating a board reverse transport process in the component mounting system of an embodiment of the disclosure.

Next, the board reverse transport process executed for one component mounting device as a target disposed in component mounting system 1 will be described with reference to FIG. 17. The process is started by inputting to input frames 53a and 53b of board number input column 53 and then operating start operation button 54 in selection screen 51c illustrated in FIG. 12.

First, it is confirmed whether or not the preset number of boards 14 which are targets of reverse transport for lane A is 0 with reference to an input value to input frame 53a (ST61). Here, in a case where the number thereof is not 0, it is determined that there is the board to be reversely transported and the operation of the board reverse transport is executed for lane A (ST62). In (ST61), if the preset number thereof is 0, the process skips (ST62) and proceeds to the next step.

In the next step, it is confirmed whether or not the preset number of boards 14 which are targets of reverse transport for the lane B is 0 (ST63). Here, in a case where the number thereof is not 0, the operation of the board reverse transport is executed for the lane B (ST64). In (ST63), if the preset number thereof is 0, the process skips (ST64) and proceeds to the next step. In the next step, the board transport mode is changed to the normal production mode (ST65). Therefore, in component mounting system 1, the board reverse carry-in process is completed and the process returns to the normal operation (ST66).

Next, a detailed flow of (ST62) in the board reverse transport process described above will be described with reference to FIG. 18. The flow corresponds to the operation description illustrated in FIGS. 8A and 8B, and illustrates an operation example of a case where the board reverse transport is performed in lane A of lane A and lane B.

First, the worker introduces board 14 to board transport line LA (lane A). It is determined whether or not introduced board 14 is detected by board detection sensor S8 (ST71). Here, if it is not detected, it is confirmed whether or not the preset limit time has elapsed since the introduction of board 14 (ST72). Here, if the limit time has not elapsed, the process returns to (ST71), the board detection is continuously monitored, and in a case where the limit time has elapsed, the process proceeds to (ST76) to perform error notification.

In (ST71), in a case where board 14 is detected, conveyor driving motors M1, M2, M3, and M4 are driven in the reverse rotation direction (ST73). Therefore, board 14 moves to the upstream side. In the movement process, it is detected whether or not board 14 already passes through the relevant device by board detection sensor 51 disposed at the most upstream of the relevant device (ST74). Here, if it has not passed, it is confirmed whether or not the preset limit time has elapsed since the board detection by board detection sensor S8 (ST75).

In (ST74), in a case where it is confirmed that the board has passed, it is determined that further board transport is unnecessary and the rotation of conveyor driving motors M1, M2, M3, and M4 is stopped (ST77). Here, the number of boards for which the reverse transport is completed by the relevant time point is counted (ST78). The counted number of the boards is compared to the set number input to input frame 53a in selection screen 51c of FIG. 12, and it is determined whether or not the board reverse transport for the set number thereof is completed (ST79).

Here, if it is not completed, the process returns to (ST71) and the same process is repeatedly carried out. In (ST79), the completion of the set number thereof is confirmed, so that the board reverse transport process in lane A is completed and the process returns to the main operation flow. Here, only the board reverse transport process for lane A is described, but the same process is executed for a case where the board reverse transport is necessary for lane B.

As described above, in the embodiment, board transport lines LA and LB for transporting boards 14 from the upstream to the downstream, and the plurality of work stations which are set in board transport lines LA and LB are provided. In component mounting system 1 performing the component mounting work in at least one work station, board transport lines LA and LB transport boards 14, which are introduced in the downstream of the work station, to the work station, and when mounting of the component on board 14 is completed in the work station, board 14 on which the component is mounted is transported from the work station to the downstream.

That is, as to the component mounting device constituting component mounting system 1, in the component mounting device including at least one board transporter constituting a part of board transport lines LA and LB, and the component mounting head for mounting the component on board 14 in the work station in the middle of the board transporter, the board transporter has the first operation mode in which board 14 received from the upstream device is transported to the work station in which the component mounting work is performed and board 14 on which the component is mounted is delivered from the work station to another downstream device when mounting of the component on board 14 is completed in the work station, and the second operation mode in which the board introduced in the downstream of the work station in which the component mounting work is performed is transported to the work station.

According to such a configuration, in a case where it is necessary to supply the board to the component mounting device of a target for performing work other than the normal production work, it is possible to quickly supply the board to a component mounting device of a target with a short transport distance by introducing the component to the downstream facility close to the component mounting device.

The component mounting system, the component mounting device, and the board transport method of the disclosure have an effect that it is possible to quickly supply the board to the component mounting device of a target, and are useful in a field of manufacturing a mounting board by mounting a component on a board.

What is claimed is:

1. A component mounting system comprising:
a board transport line configured to transport a board from an upstream side to a downstream side; and
a plurality of work stations disposed in the board transport line and configured to perform component mounting on the board,
wherein the board transport line is configured to:
transport a board from the downstream side to a work station in the upstream side in a first reverse transportation mode; and
transport the board from the work station to the downstream side in a normal transportation mode when the mounting of a component on the board is completed in the work station,
wherein when mounting of the component is completed in the work station, the first reverse transportation mode is automatically switched to the normal transportation mode.

2. The component mounting system of claim 1,
wherein the board transport line is configured to prohibit another board from being carried into the work station from the upstream side until the board in the downstream side reaches the work station.

3. The component mounting system of claim 2,
wherein the board transport line is configured to enable the other board to be carried into the work station from the upstream side when the board is carried away from the work station after the mounting of the component was completed.

4. A component mounting device comprising:
a board transporter constituting a board transport line for transporting a board from an upstream side to a downstream side; and
a component mounting head configure to mount a component onto the board in a work station in the middle of the board transport line,
wherein the board transporter comprises:
a first operation mode in which a board received from the upstream side is transported to the work station and the board is transported in the downstream side when mounting of the component on the board is completed in the work station, and
a second operation mode in which a board in the downstream side is transported to the work station in the upstream side,
wherein when mounting of the component is completed in the work station, the first reverse transportation mode is automatically switched to the normal transportation mode.

5. The component mounting device of claim 4,
wherein the board transporter is configured to prohibit another board from being carried into the work station from the upstream side until the board in the work station is transported to the downstream side according to the second operation mode.

6. The component mounting device of claim 4,
wherein the board transporter is configured to transport, to the downstream side, the board which was carried into the work station according to the second operation mode and on which the mounting of the component has been completed.

7. The component mounting device of claim 6,
wherein the board transporter is switched to the first operation mode after the board was carried into the work station according to the second operation mode, and is configured to transport, to the downstream side, the board on which the mounting of the component is completed according to the first operation mode.

8. The component mounting device of claim 4,
wherein the board transporter further has a third operation mode in which a board in the downstream side is transported to the upstream side.

9. A board transport method in a component mounting device including a board transporter constituting a board transport line for transporting a board from an upstream side to a downstream side, and a component mounting head mounting a component on the board in a work station in the middle of the board transport line, the method comprising:
- transporting a board in the downstream side to a work station in the upstream side by the board transporter in a reverse transportation mode;
- transporting the board toward a stop position which is set in the work station in the upstream side by the board transporter;
- when the board overpasses the stop position, transporting the board toward the downstream side and stopping the board at the stop position by the board transporter; and
- transporting the board from the work station to the downstream side in a normal mode when the mounting of a component on the board is completed in the work station in a normal transportation mode,
- wherein when mounting of the component is completed in the work station, the first reverse transportation mode is automatically switched to the normal transportation mode.

10. A component mounting system comprising:
- a board transport line configured to transport a board from an upstream side to a downstream side; and
- a plurality of work stations disposed in the board transport line and configured to perform component mounting on the board,
- wherein the board transport line is configured to:
  - transport a board from the downstream side to a work station in the upstream side in a first reverse transportation mode; and
  - transport the board from the work station to the downstream side in a normal transportation mode when the mounting of a component on the board is completed in the work station,
- wherein the board transport line comprises a first component mounting device and a second component mounting device aligned in an order, and the board transport line is further configured to transport the board from the downstream side to the first component mounting device in the upstream side by passing through the second component mounting device in a second reverse transporting mode.

* * * * *